(12) United States Patent
Shang et al.

(10) Patent No.: US 12,232,374 B2
(45) Date of Patent: Feb. 18, 2025

(54) DISPLAY SUBSTRATE AND DISPLAY DEVICE

(71) Applicants: Chengdu BOE Optoelectronics Technology Co., Ltd., Chengdu (CN); BOE Technology Group Co., Ltd., Beijing (CN)

(72) Inventors: Tinghua Shang, Beijing (CN); Yi Zhang, Beijing (CN); Haigang Qing, Beijing (CN); Pengfei Yu, Beijing (CN); Yang Zhou, Beijing (CN)

(73) Assignees: Chengdu BOE Optoelectronics Technology Co., Ltd., Chengdu (CN); BOE Technology Group Co., Ltd., Beijing (CN)

(*) Notice: Subject to any disclaimer, the term of this patent is extended or adjusted under 35 U.S.C. 154(b) by 0 days.

(21) Appl. No.: 17/416,595

(22) PCT Filed: Aug. 31, 2020

(86) PCT No.: PCT/CN2020/112496
§ 371 (c)(1),
(2) Date: Jun. 21, 2021

(87) PCT Pub. No.: WO2022/041204
PCT Pub. Date: Mar. 3, 2022

(65) Prior Publication Data
US 2023/0200155 A1   Jun. 22, 2023

(51) Int. Cl.
*H10K 59/131* (2023.01)
*H10K 59/35* (2023.01)
(Continued)

(52) U.S. Cl.
CPC ......... *H10K 59/131* (2023.02); *H10K 59/351* (2023.02); *H10K 59/80516* (2023.02); *H10K 59/126* (2023.02)

(58) Field of Classification Search
CPC .............. H10K 59/131; H10K 59/351; H10K 59/80516; H10K 59/126; H10K 59/80515;
(Continued)

(56) References Cited

U.S. PATENT DOCUMENTS

2016/0180769 A1   6/2016   Wacyk
2016/0351724 A1*  12/2016  Zhao ................. H01L 29/42384
(Continued)

FOREIGN PATENT DOCUMENTS

CN   108155205 A   6/2018
CN   109427854 A   3/2019
(Continued)

*Primary Examiner* — Shaun M Campbell
*Assistant Examiner* — Teresa M. Arroyo
(74) *Attorney, Agent, or Firm* — ArentFox Schiff LLP; Michael Fainberg

(57) ABSTRACT

Embodiments of this disclosure provide a display substrate and a display device. The display substrate includes: sub-pixels located on a base substrate; a first conductive layer located on one side of the base substrate, and including signal lines sequentially disposed in a first direction and extending towards a second direction, and signal line bulges and anode adaptor parts located on the same side of the signal line and disposed alternately; and anodes located between the first conductive layer and a pixel defining layer. Each anode includes an effective part exposed by a corresponding sub-pixel opening, the effective parts of at least part of the sub-pixels have overlapping regions with the signal line bulges and the anode adaptor parts in the second direction, and the second direction is perpendicular to the first direction.

20 Claims, 16 Drawing Sheets

(51) Int. Cl.
*H10K 59/80* (2023.01)
*H10K 59/126* (2023.01)

(58) Field of Classification Search
CPC ......... G09G 3/3233; G09G 2300/0819; G09G 2300/0842; G09G 2300/0861; G09G 2310/0251
See application file for complete search history.

(56) References Cited

U.S. PATENT DOCUMENTS

| | | | |
|---|---|---|---|
| 2017/0062546 A1* | 3/2017 | Kim | G09G 3/3225 |
| 2018/0254304 A1* | 9/2018 | Hong | H10K 59/80515 |
| 2019/0064552 A1 | 2/2019 | Kim et al. | |
| 2019/0114459 A1* | 4/2019 | Ma | G06V 40/1318 |
| 2021/0064103 A1* | 3/2021 | Zhang | H04B 10/2569 |
| 2021/0174709 A1* | 6/2021 | Xiang | H05K 1/028 |
| 2021/0320156 A1* | 10/2021 | Shang | H10K 59/124 |
| 2021/0359075 A1* | 11/2021 | Liu | H10K 59/131 |
| 2022/0102583 A1* | 3/2022 | Baumheinrich | H01L 27/156 |
| 2022/0140045 A1* | 5/2022 | Huang | H10K 59/122 257/40 |
| 2022/0310708 A1* | 9/2022 | Dai | H10K 59/131 |
| 2022/0320235 A1* | 10/2022 | Shu | H10K 59/131 |

FOREIGN PATENT DOCUMENTS

| | | |
|---|---|---|
| CN | 110047898 A | 7/2019 |
| CN | 110690360 A | 1/2020 |
| CN | 111403452 A | 7/2020 |
| KR | 20190077673 A | 7/2019 |

\* cited by examiner

DISPLAY SUBSTRATE AND DISPLAY DEVICE

CROSS-REFERENCE TO RELATED APPLICATIONS

This application is the National Stage of International Application No. PCT/CN2020/112496, filed on Aug. 31, 2020, the entire contents of which are incorporated herein by reference.

FIELD

Embodiments of the present disclosure relate to the technical field of display, in particular to a display substrate and a display device.

BACKGROUND

With the continuous development of display technology, organic light emitting diode (OLED) display substrates have been increasingly applied to various electronic equipment due to their advantages such as self-luminescence, wide viewing angle, high contrast, low power consumption, and high response speed. However, the OLED display substrates of the prior art have the problems of large view angle color shift, and one side is similar to be red and the other side is similar to be cyan when the OLED display substrates are viewed.

SUMMARY

Embodiments of the present disclosure provide a display substrate, including:
a plurality of sub-pixels on a base substrate;
a first conductive layer on one side of the base substrate, here the first conductive layer includes a plurality of signal lines which are sequentially disposed in a first direction and extend towards a second direction, and signal line bulges and anode connection parts located between two adjacent signal lines among at least part of the plurality of signal lines and disposed alternately, and the signal line bulges are integrally connected with the signal lines;
a pixel defining layer located on a side, facing away from the base substrate, of the first conductive layer, here the pixel defining layer includes a plurality of sub-pixel openings corresponding to the sub-pixels; and
anodes located between the first conductive layer and the pixel defining layer, here each anode includes an effective part exposed by the corresponding sub-pixel opening, and the anode connection parts are connected with the anodes through insulating layer via holes.

The effective parts of at least part of the sub-pixels have overlapping regions with the signal line bulges and the anode connection parts in the second direction, and the second direction is perpendicular to the first direction.

In one possible implementation, the plurality of sub-pixels include first sub-pixels and second sub-pixels, and an area of an anode of the first sub-pixel is larger than an area of an anode of the corresponding second sub-pixel.

An effective part of each first sub-pixel has overlapping regions with the corresponding signal line bulge and the corresponding anode connection part in the second direction.

In one possible implementation, the overlapping region of the effective part of each first sub-pixel and the corresponding signal line bulge is a first overlapping region, and the overlapping region of the effective part of each first sub-pixel and the corresponding anode connection part is a second overlapping region.

In the second direction, the first overlapping region and the second overlapping region are located on both sides of a center of the effective part of the corresponding first sub-pixel, respectively.

In one possible implementation, a ratio of a spacing from the first overlapping region to the center of the effective part of the corresponding first sub-pixel to a spacing from the second overlapping region to the center of the effective part of the first sub-pixel is 0.8-1.2.

In one possible implementation, an orthographic projection of an anode connection part of each second sub-pixel on the base substrate covers a center of an orthographic projection of an effective part of the second sub-pixel on the base substrate, and a maximum size of the anode connection part of each second sub-pixel in the second direction is greater than a maximum size of the effective part in the second direction.

In one possible implementation, a length of an anode connection part of each second sub-pixel in the second direction is greater than a length of an anode connection part of the corresponding first sub-pixel in the second direction.

In one possible implementation, each signal line bulge includes: a first bulge connection part and a second bulge connection part for connecting the first bulge connection part with the corresponding signal line.

A length of the first bulge connection part in the second direction is greater than a length of the corresponding second bulge connection part in the second direction.

In one possible implementation, a ratio of a length of the first bulge connection part in the first direction to a length of the corresponding anode connection part in the first direction is 0.8-1.2.

In one possible implementation, the length of the first bulge connection part in the second direction is less than the length of the corresponding anode connection part in the second direction.

In one possible implementation, in a direction from the second bulge connection part to the corresponding first bulge connection part, an interval exists between the first bulge connection part and the nearest signal line.

In one possible implementation, a ratio of a length of the interval in the first direction to a length of the corresponding second bulge connection part in the first direction is 0.8-1.2.

In one possible implementation, the effective part of each first sub-pixel is substantially in a diamond shape.

An overlapping region of the effective part of the first sub-pixel and a corresponding first bulge connection part is substantially a triangular region; the overlapping region of the effective part of the first sub-pixel and the corresponding anode connection part is substantially a triangular region; and the overlapping region of the effective part of the first sub-pixel and the corresponding first bulge connection part and the overlapping region of the effective part of the first sub-pixel and the corresponding anode connection part correspond to two opposite corners of the diamond, respectively.

In one possible implementation, each anode includes a main part and an auxiliary part electrically connected to each other; the main part includes the effective part and an anode extension extending from the effective part.

An anode shield is further located on a side, facing the corresponding second sub-pixel, of an anode extension of each first sub-pixel, an orthographic projection of the anode shield on the base substrate covers a first region, and the first region includes at least part of a region between two channel regions of a threshold compensation transistor in a pixel circuit corresponding to the corresponding second sub-pixel.

In one possible implementation, in the same sub-pixel, a side edge, away from the anode connection part, of the first bulge connection part and a side edge, away from the anode connection part, of the second bulge connection part are in substantially the same straight line.

In one possible implementation, a shape of the effective part of each second sub-pixel is substantially a quadrangular region.

In a column direction, a size of a portion, overlapping the corresponding anode connection part, of the effective part accounts for 50%-100% of a size of the effective part.

In one possible implementation, a first insulating layer is disposed between the anodes and the first conductive layer; auxiliary parts are electrically connected with the anode connection parts through first via holes penetrating the first insulating layer.

Orthographic projections of the first via holes on the base substrate do not overlap orthographic projections of regions, overlapping the effective parts, of the anode connection parts on the base substrate.

In one possible implementation, patterns of overlapping signal line bulges of every two adjacent sub-pixels in a column are different.

In one possible implementation, each first sub-pixel includes: a first color sub-pixel and a third color sub-pixel; each second sub-pixel includes: a second color sub-pixel and a fourth color sub-pixel.

The first color sub-pixels are red sub-pixels, the third color sub-pixels are blue sub-pixels, and the second color sub-pixels and the fourth color sub-pixels are green sub-pixels.

In one possible implementation, each signal line further includes a signal line protrusion, and the signal line bulges and the signal line protrusions have the same structure; the plurality of signal lines include first signal lines and second signal lines; one column of sub-pixels correspond to one first signal line and one second signal line; signal line protrusions of the first signal lines are electrically connected with sub-pixels in odd-numbered lines, respectively, and signal line protrusions of the second signal lines are electrically connected with sub-pixels in even-numbered lines, respectively.

In the two first signal lines and the two second signal lines corresponding to every two adjacent columns of sub-pixels, the two first signal lines are adjacent and form a first signal line group, alternatively, the two second signal lines are adjacent and form a second signal line group.

In one possible implementation, the effective parts of at least part of the sub-pixels have overlapping regions with the two adjacent signal lines in the first direction.

In one possible implementation, in the sub-pixels, the effective parts have third overlapping regions with first signal lines, the effective parts have fourth overlapping regions with second signal lines, and each third overlapping region and each fourth overlapping region are located on both sides of the effective part of the corresponding anode in the first direction.

Embodiments of the present disclosure further provide a display device including the display substrate as provided in embodiments of the present disclosure.

DETAILED DESCRIPTION OF THE EMBODIMENTS

Figure 1:
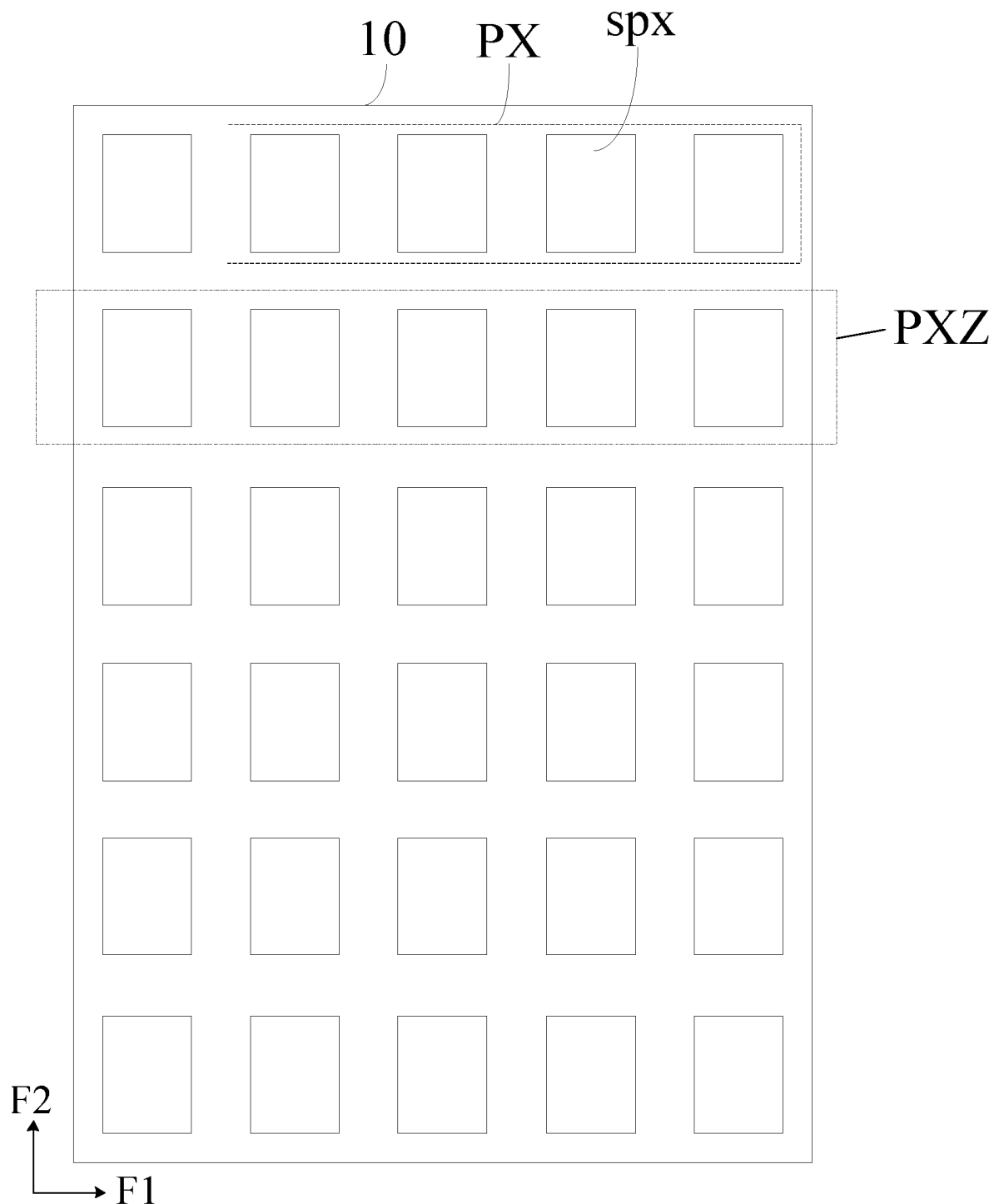
FIG. 1 is a schematic structural diagram of a display substrate provided by an embodiment of the disclosure.

In order to make the objectives, technical solutions, and advantages of the embodiments of the present disclosure clearer, the technical solutions of the embodiments of the present disclosure will be described clearly and completely in conjunction with the accompanying drawings of the embodiments of the present disclosure. It is to be understood that the described embodiments are some, but not all, embodiments of the present disclosure. Also, embodiments and features in the embodiments of the disclosure may be combined with one another without conflict. Based on the described embodiments of the present disclosure, all other embodiments attainable by one of ordinary skill in the art without involving any inventive effort are within the scope of the present disclosure.

Unless otherwise defined, the technical terms or scientific terms used herein shall have the usual meanings understood by those with ordinary skills in the field to which this disclosure belongs. The "first", "second" and similar words used in the present disclosure do not denote any order, quantity or importance, but are only used to distinguish different components. "Including" or "containing" and other similar words mean that an element or article that precedes the word is inclusive of the element or article listed after the word and equivalents thereof, but does not exclude other elements or articles. The terms "connecting" or "connected", and the like, are not limited to physical or mechanical connections, but may include electrical connections, whether direct or indirect.

It should be noted that the dimensions and shapes of the various figures in the drawings are not to scale and are intended to be merely illustrative of the contents of the present disclosure. The same or similar reference numerals refer to the same or similar elements or elements having the same or similar functions throughout.

As shown in FIG. 1, a display substrate provided by the embodiments of the present disclosure may include: a base substrate 10, and a plurality of repeating units PX located on the base substrate 10. At least one repeating unit PX (e.g., each repeating unit) of the plurality of repeating units PX may include a plurality of sub-pixels spx. For example, the plurality of sub-pixels may include a first color sub-pixel spx1, a second color sub-pixels spx2, a third color sub-pixels spx3, and a fourth color sub-pixels spx4. That is, the repeating unit may include the first color sub-pixel spx1, the second color sub-pixel spx2, the third color sub-pixel spx3, and the fourth color sub-pixel spx4. Therefore, the display substrate may mix light using the first color sub-pixels spx1, the second color sub-pixels spx2, the third color sub-pixels spx3 and the fourth color sub-pixels spx4, thereby realizing color display. In some examples, a first color, a second color, a third color, and a fourth color may be selected from red, green, and blue, for example, the first color is red, the second color is green, the third color is blue, and the fourth color is green. Of course, the embodiments of the present disclosure include, but are not limited to, these. The following will be explained with the example that the repeating unit includes the first color sub-pixel spx1, the second color sub-pixel spx2, the third color sub-pixel spx3, and the fourth color sub-pixel spx4, the second color and the fourth color are green, the first color is red, and the third color is blue.

Illustratively, as shown in FIG. 1, multiple repeating units are disposed in a first direction F1 to form a repeating unit group PXZ. Repeating unit groups are disposed in a second direction F2. The first direction F1 is different from the second direction F2. Illustratively, the first direction F1 is perpendicular to the second direction F2. For example, the first direction F1 is a row direction and the second direction F2 is a column direction. Alternatively, the first direction F1 is a column direction and the second direction F2 is a row direction.

Figure 2A:
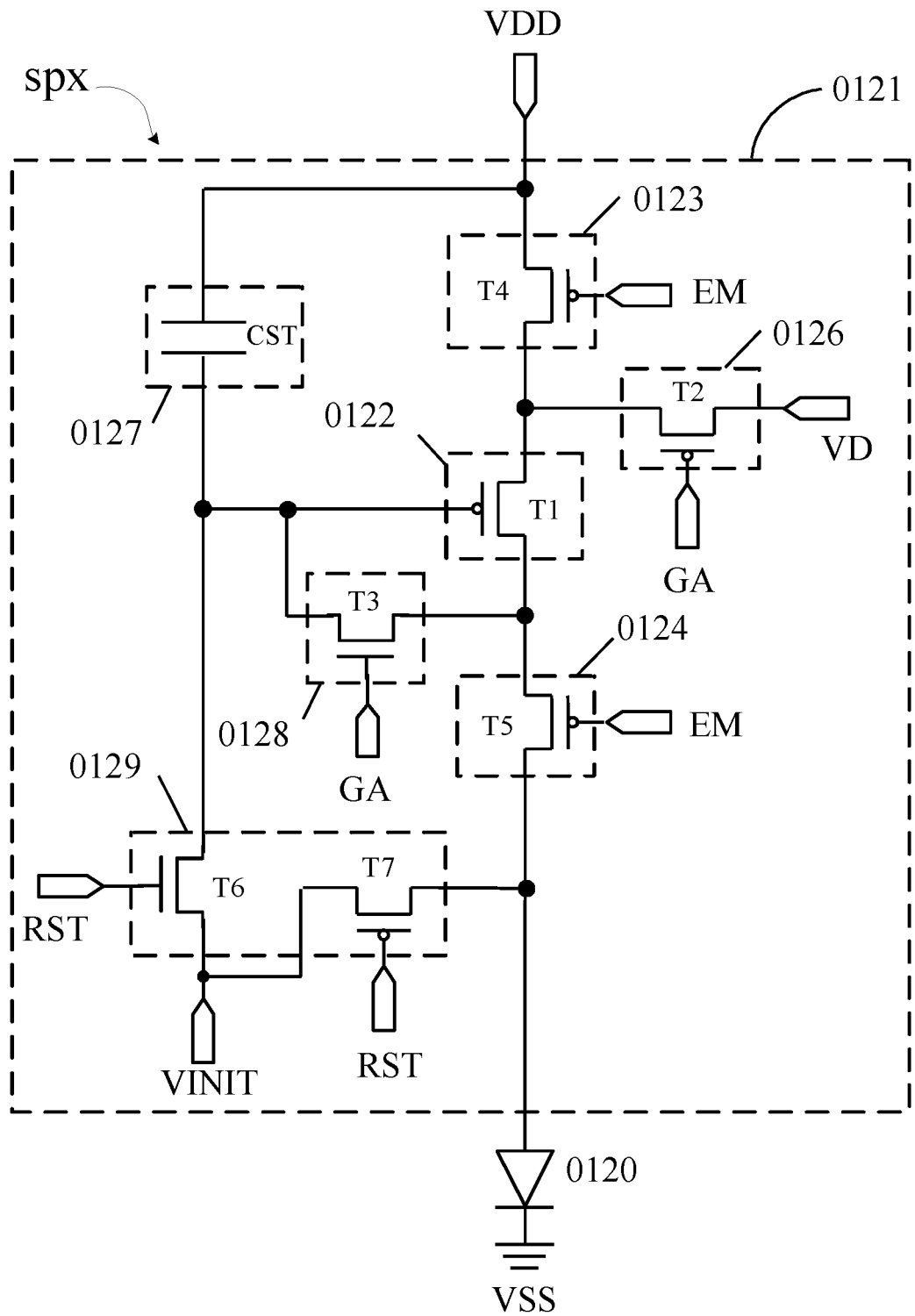
FIG. 2A is a schematic structural diagram of a pixel circuit provided by an embodiment of the disclosure.

Illustratively, as shown in FIGS. 1 and 2A, at least one sub-pixel spx (e.g., each sub-pixel) of the plurality of sub-pixels spx may include: a pixel circuit 0121 and a light-emitting element 0120. The pixel circuit 0121 has a transistor and a capacitor, and generates an electrical signal through the interaction of the transistor and the capacitor, and the generated electrical signal (e.g., a current) is input into the light-emitting element 0120 to drive the light-emitting element 0120 to emit light. An anode of the light-emitting element 0120 is connected to the pixel circuit 0121, and a cathode of the light-emitting element 0120 is connected to a power terminal.

As shown in FIG. 2A, the pixel circuit 0121 may include: a drive control circuit 0122, a first light emitting control circuit 0123, a second light emitting control circuit 0124, a data writing circuit 0126, a storage circuit 0127, a threshold compensation circuit 0128, and a reset circuit 0129.

The drive control circuit 0122 may include a control terminal, a first terminal, and a second terminal. The drive control circuit 0122 is configured to provide the light-emitting element 0120 a drive current for driving the light-emitting element 0120 to emit light. For example, the first light emitting control circuit 0123 is connected to the first terminal of the drive control circuit 0122 and a first power terminal VDD. The first light emitting control circuit 0123 is configured to realize connective conduction or disconnection between the drive control circuit 0122 and the first power terminal VDD.

The second light emitting control circuit 0124 is electrically connected to the second terminal of the drive control circuit 0122 and the anode of the light-emitting element 0120. The second light emitting control circuit 0124 is configured to realize connective conduction or disconnection between the drive control circuit 0122 and the light-emitting element 0120.

The data writing circuit 0126 is electrically connected to the first terminal of the drive control circuit 0122, and the data writing circuit 0126 is configured to write a signal on a data line VD to the storage circuit 0127.

The storage circuit 0127 is electrically connected to the control terminal of the drive control circuit 0122 and the first power terminal VDD, and is configured to store a data signal as well as information of the drive control circuit 0122.

The threshold compensation circuit 0128 is electrically connected to the control terminal and the second terminal of the drive control circuit 0122, and is configured to perform threshold compensation on the drive control circuit 0122.

The reset circuit 0129 is electrically connected to the control terminal of the drive control circuit 0122 and the anode of the light-emitting element 0120, and is configured to reset the anode of the light-emitting element 0120 and to reset the control terminal of the drive control circuit 0122.

The light-emitting element 0120 may be configured as an electroluminescent diode such as at least one of an OLED, a QLED, a micro LED, and a micro OLED. The light-emitting element 0120 may include the anode, a light-emitting layer, and the cathode which are laminated. Further, the light-emitting layer may include film layers such as a hole injection layer, a hole transport layer, an electron transport layer, and an electron injection layer. Of course, in a practical application, the light-emitting element 0120 may be designed and determined according to requirements of a practical application environment, and is not limited thereto.

Illustratively, as shown in FIG. 2A, the drive control circuit 0122 includes a drive transistor T1. The control terminal of the drive control circuit 0122 includes a drive gate of the drive transistor T1, the first terminal of the drive control circuit 0122 includes a first electrode of the drive transistor T1, and the second terminal of the drive control circuit 0122 includes a second electrode of the drive transistor T1.

Illustratively, as shown in FIG. 2A, the data writing circuit 0126 includes a data writing transistor T2. The storage circuit 0127 includes a storage capacitor CST. The threshold compensation circuit 0128 includes a threshold compensation transistor T3. The first light emitting control circuit 0123 includes a first light emitting control transistor T4. The second light emitting control circuit 0124 includes a second light emitting control transistor T5. The reset circuit 0129 includes an initialization transistor T6 and a reset transistor T7.

Specifically, a first electrode of the data writing transistor T2 is electrically connected to the first electrode of the drive transistor T1, a second electrode of the data writing transistor T2 is configured to be electrically connected to the data line VD to receive the data signal, and a gate of the data writing transistor T2 is configured to be electrically connected to a scan line GA to receive a scan signal.

A first electrode of the storage capacitor CST is electrically connected to the first power terminal VDD, and a second electrode of the storage capacitor CST is electrically connected to the drive gate of the drive transistor T1.

A first electrode of the threshold compensation transistor T3 is electrically connected to the second electrode of the drive transistor T1, a second electrode of the threshold compensation transistor T3 is electrically connected to the drive gate of the drive transistor T1, and a gate of the threshold compensation transistor T3 is configured to be electrically connected to the scan line GA to receive the scan signal.

A first electrode of the initialization transistor T6 is configured to be electrically connected to an initialization line VINIT to receive a reset signal, a second electrode of the initialization transistor T6 is electrically connected to the drive gate of the drive transistor T1, and a gate of the initialization transistor T6 is configured to be electrically connected to a reset line RST to receive a reset control signal.

A first electrode of the reset transistor T7 is configured to be electrically connected to the initialization line VINIT to receive the reset signal, a second electrode of the reset transistor T7 is electrically connected to the anode of the light-emitting element 0120, and a gate of the reset transistor T7 is configured to be electrically connected to the reset line RST to receive the reset control signal.

A first electrode of the first light emitting control transistor T4 is electrically connected to the first power terminal VDD, a second electrode of the first light emitting control transistor T4 is electrically connected to the first electrode of the drive transistor T1, and a gate of the first light emitting control transistor T4 is configured to be electrically connected to a light emitting control line EM to receive a light emitting control signal.

A first electrode of the second light emitting control transistor T5 is electrically connected to the second electrode of the drive transistor T1, a second electrode of the second light emitting control transistor T5 is electrically connected to the anode of the light-emitting element 0120, and a gate of the second light emitting control transistor T5 is configured to be electrically connected to the light emitting control line EM to receive the light emitting control signal.

The cathode of the light-emitting element 0120 is electrically connected to a second power terminal VSS. The first electrode or the second electrode of each of the above transistors may be determined as a source electrode or drain electrode according to an actual application, which is not limited thereto. The transistors may be P-type transistors, N-type transistors, or pixel circuits formed by mixing P-type transistors and N-type transistors, which is not limited thereto. Embodiments of the present disclosure are illustrated with each transistor being a P-type transistor.

Illustratively, one of the first power terminal VDD and the second power terminal VSS is a high voltage terminal and the other is a low voltage terminal. For example, in the embodiment shown in FIG. 2A, the first power terminal VDD is a voltage source to output a constant first voltage, for example, the first voltage is a positive voltage or a high voltage; and the second power terminal VSS may be a voltage source to output a constant second voltage, for example, the second voltage is a low voltage or zero or a negative voltage. For example, in some examples, the second power terminal VSS may be grounded.

Figure 2B:
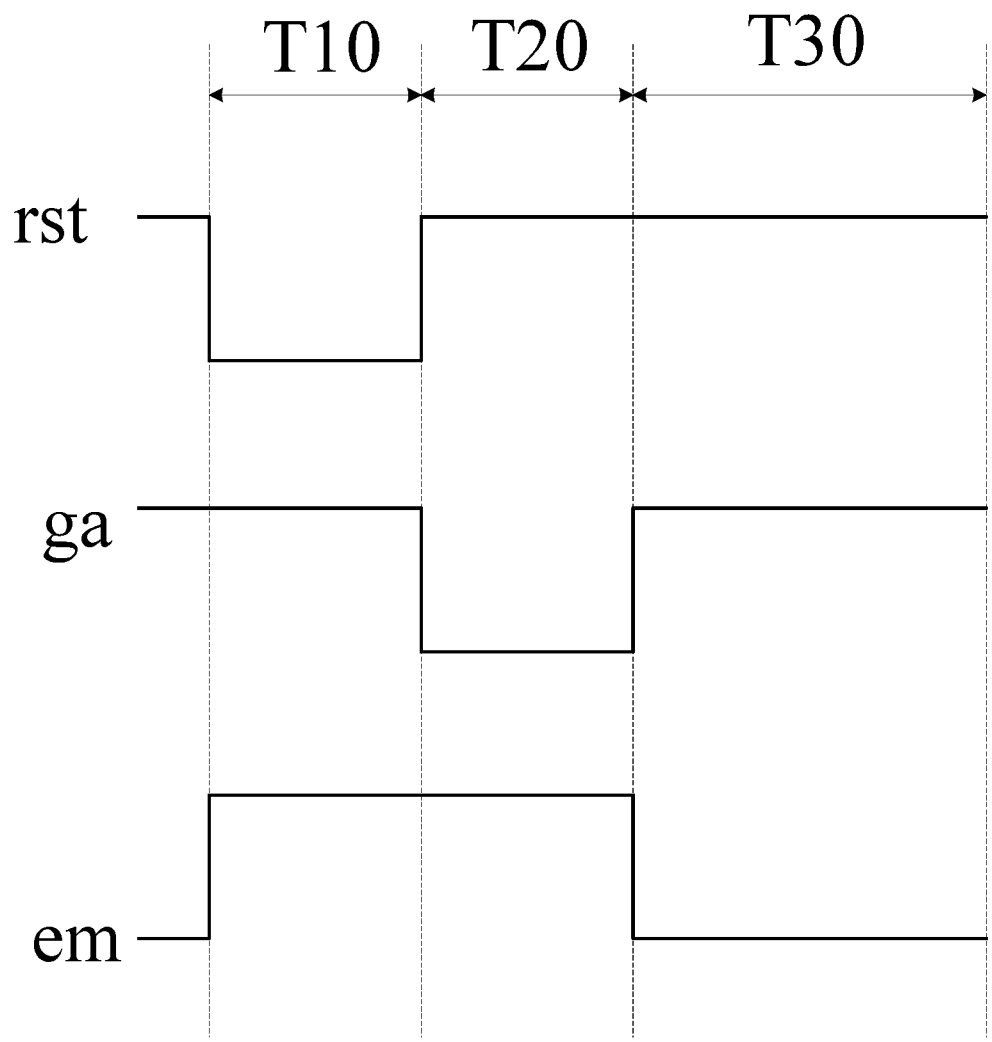
FIG. 2B is a signal timing diagram provided by an embodiment of the disclosure.

FIG. 2B is a signal timing diagram corresponding to the pixel circuit shown in FIG. 2A. In a frame of display time, a working process of the pixel circuit has three stages: T10, T20, and T30. rst represents the signals transmitted on the reset lines RST, ga represents the signals transmitted on the scan lines GA, and em represents the signals transmitted on the light emitting control lines EM.

In the stage T10, the signals rst control the initialization transistor T6 to be conducted so that the signal transmitted on the initialization line VINIT can be supplied to the drive gate of the drive transistor T1 so as to reset the drive gate of the drive transistor T1. The signals rst control the reset transistor T7 to be conducted to supply the signal transmitted on the initialization line VINIT to an anode of a light-emitting element 0120 of an upper stage so as to reset the anode of the light-emitting element 0120 of the upper stage. Moreover, in this stage, the signals ga control both the data writing transistor T2 and the threshold compensation transistor T3 to be turned off, and the signals em control both the first light emitting control transistor T4 and the second light emitting control transistor T5 to be turned off.

In the stage T20, the signals ga control the data writing transistor T2 and the threshold compensation transistor T3 to be conducted, and the conducted data writing transistor T2 enables the data signal transmitted on the data line VD to charge the drive gate of the drive transistor T1 so that a voltage of the drive gate of the drive transistor T1 may change to Vdata+Vth. Vth represents a threshold voltage of the drive transistor T1, and Vdata represents a voltage of the data signal. Moreover, in this stage, the signals rst control both the initialization transistor T6 and the reset transistor T7 to be turned off, and the signals em control both the first light emitting control transistor T4 and the second light emitting control transistor T5 to be turned off.

In the stage T30, the signals em control both the first light emitting control transistor T4 and the second light emitting control transistor T5 to be conducted. The conducted first light emitting control transistor T4 supplies a voltage Vdd of the first power terminal VDD to the first electrode of the drive transistor T1 so that a voltage of the first electrode of the drive transistor T1 may be Vdd. The drive transistor T1 generates the drive current according to the gate voltage Vdata+|Vth| and the voltage Vdd of the first electrode. The drive current is supplied to the light-emitting element 0120 through the conducted second light-emitting control transistor T5, and drives the light-emitting element 0120 to emit light. Moreover, in this stage, the signals rst control the initialization transistor T6 and the reset transistor T7 to be turned off, and the signals ga control the data writing transistor T2 and the threshold compensation transistor T3 to be turned off.

It should be noted that in the embodiments of the present disclosure, the first electrodes of the transistors may be sources and the second electrodes of the transistors may be drains; or the first electrodes are drains and the second electrodes are sources, which can be designed and determined according to requirements of practical applications. Moreover, the pixel circuit in each sub-pixel may be a structure including other numbers of transistors in addition to the structure shown in FIGS. 2A and 2B, which is not limited by the embodiments of the present disclosure. The structure shown in FIG. 2A is exemplified below.

Illustratively, the display substrate includes the base substrate 10, a transistor array layer disposed on the base substrate 10, a first conductive layer on a side, facing away from the base substrate 10, of the transistor array layer, a first insulating layer on a side, facing away from the base substrate 10, of the first conductive layer, anodes on a side, facing away from the base substrate 10, of the first insulating layer, light-emitting layers on sides, facing away from the base substrate 10, of the anodes, and cathodes on sides, facing away from the base substrate 10, of the light-emitting layers. The transistor(s) and the capacitor(s) in each pixel circuit, the scan lines, the reset lines, the light emitting control lines EM, the initialization lines VINIT, the first power supply signal lines VDD of the first power terminals VDD and the like may be formed on the transistor array layer. Illustratively, the transistor array layer may include an active semiconductor layer 0310, a gate conductive layer 0320, a reference conductive layer 0330, and a source-drain metal layer 0340.

Figure 3:
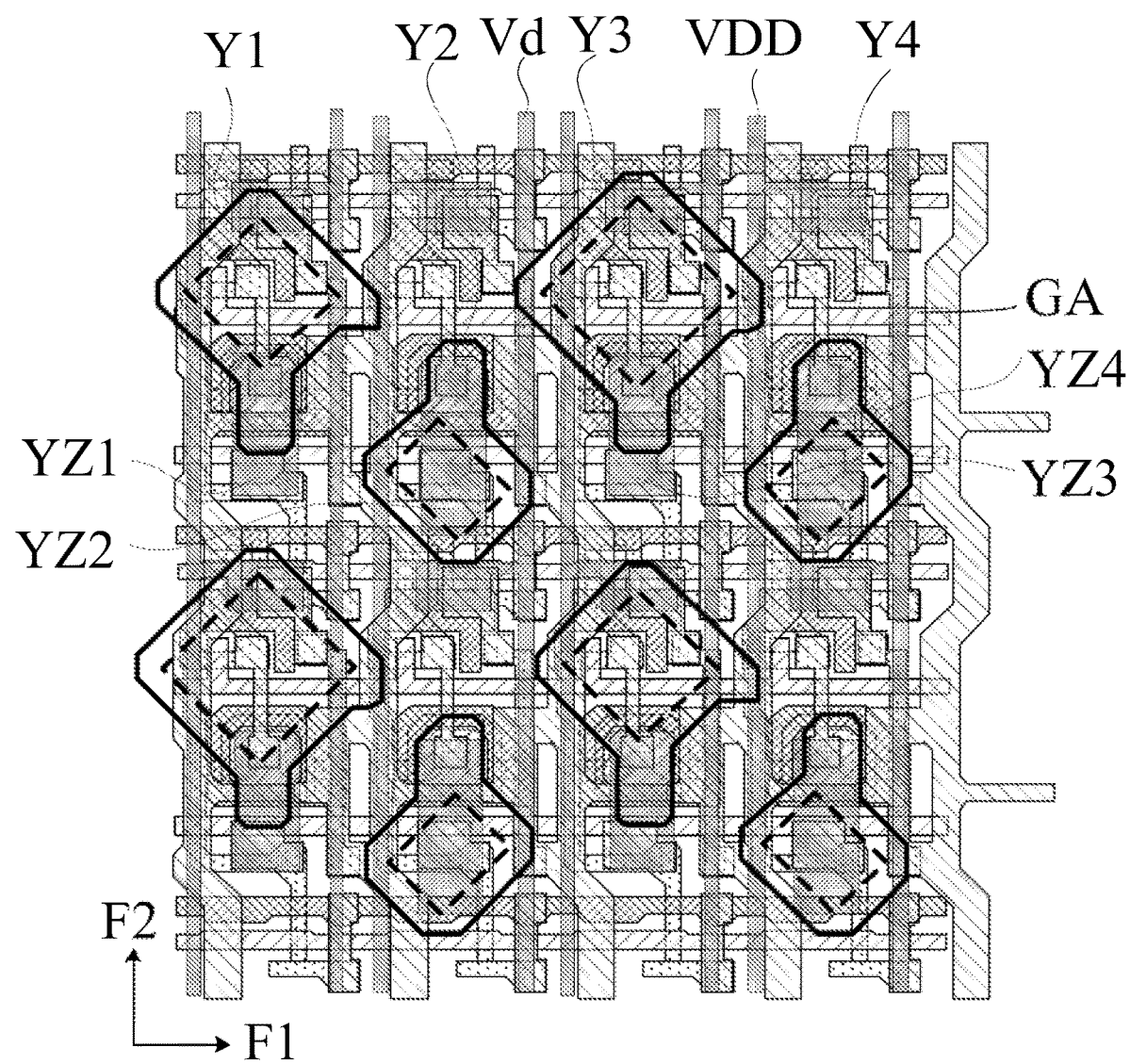
FIG. 3 is a schematic layout structure diagram of a display substrate provided by an embodiment of the disclosure.
Figure 4A:
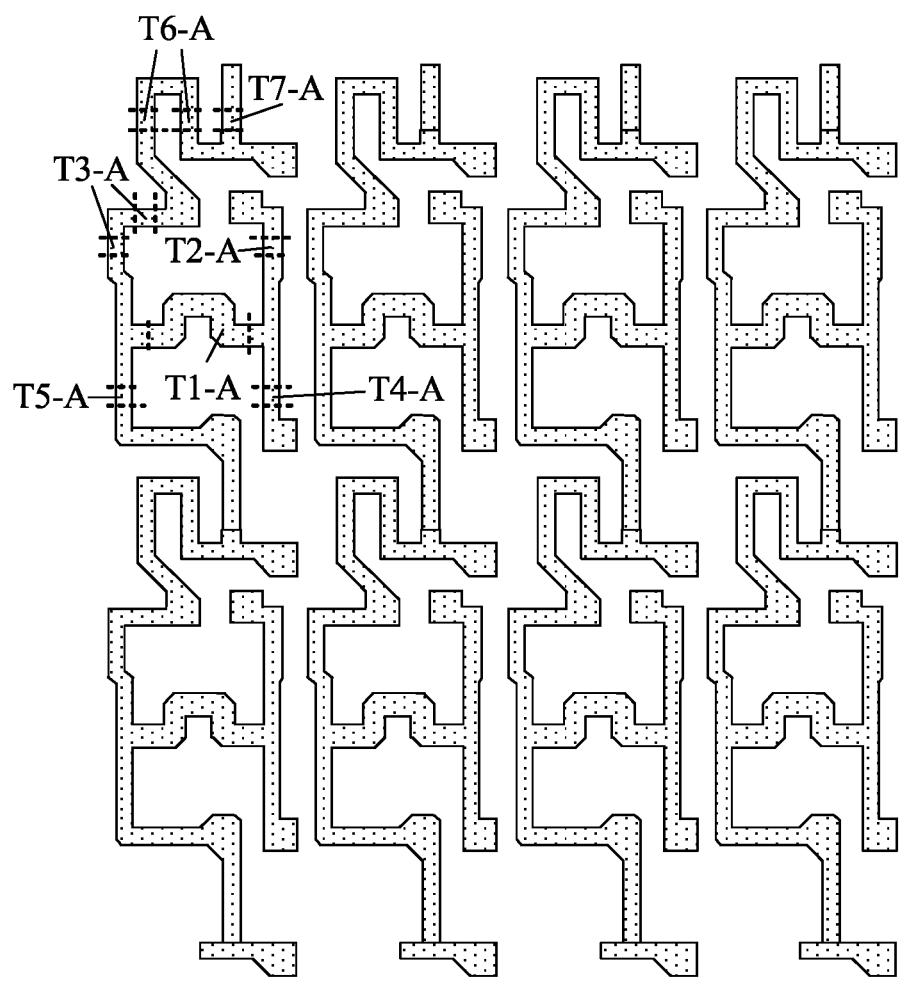
FIG. 4A is a schematic layout structure diagram of an active semiconductor layer provided by an embodiment of the disclosure.

Illustratively, FIGS. 3 and 4A show the active semiconductor layer 0310 of the pixel circuits 0121. The active semiconductor layer 0310 may be formed by patterning a semiconductor material, for example, a poly-silicon material. The active semiconductor layer 0310 may be used to fabricate drive active layers T1-A of the drive transistors T1, active layers T2-A of the data writing transistors T2, active layers T3-A of the threshold compensation transistors T3, active layers T4-A of the first light emitting control transistors T4, active layers T5-A of the second light emitting control transistors T5, active layers T6-A of the first reset transistors T6 and active layers T7-A of the second reset transistors T7. Each active layer may include a source region, a drain region, and a channel region between the source region and the drain region. For example, the active layers of the transistors are integrated.

Illustratively, the active semiconductor layer 0310 may be made of amorphous silicon, poly-silicon, an oxide semiconductor material, or the like. It should be noted that the source regions and the drain regions described above may be regions doped with n-type impurities or p-type impurities. For example, the channel regions may be undoped regions, or regions of a different doping type from the source regions and the drain regions. For example, the channel regions may be a part overlapping gate electrodes in a direction perpendicular to the base substrate, and in each active layer, the source region and the drain region of the same transistor may be parts on both sides of the channel region, respectively, and substantially not overlap the corresponding gate electrode (regardless of the effect of ion diffusion).

Figure 4B:
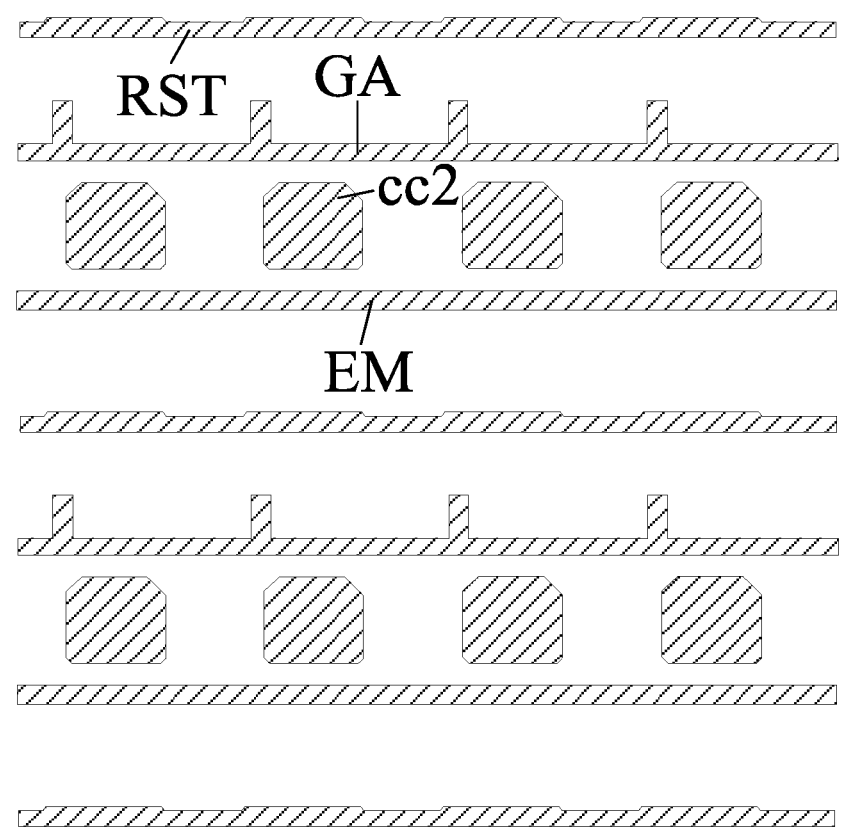
FIG. 4B is a schematic layout structure diagram of a gate conductive layer provided by an embodiment of the disclosure.

Illustratively, the gate insulating layer is formed over the above-mentioned active semiconductor layer 0310 to protect the active semiconductor layer 0310. FIGS. 3 and 4B show the gate conductive layer 0320 of the pixel circuits 0121. The gate conductive layer 0320 is disposed over the gate insulating layer to be insulated from the active semiconductor layer 0310. The gate conductive layer 0320 may include second electrodes cc2 of the storage capacitors CST, the scan lines GA, the reset lines RST, the light emitting control lines EM, and the gates of the drive transistors T1, the data writing transistors T2, the threshold compensation transistors T3, the first light emitting control transistors T4, the second light emitting control transistors T5, the first reset transistor T6, and the second reset transistor T7.

For example, as shown in FIG. 4B, the gates of the data writing transistors T2 may be parts where the scan lines GA overlap the active semiconductor layer 0310. The gates of the first light emitting control transistors T4 may be first parts where the light emitting control lines EM overlap the active semiconductor layer 0310, the gates of the second light emitting control transistors T5 may be second parts where the light emitting control lines EM overlap the active semiconductor layer 0310. The gates of the first reset transistors T6 may be first parts where the reset lines RST overlap the active semiconductor layer 0310, the gates of the second reset transistors T7 may be second parts where the reset lines RST overlap the active semiconductor layer 0310. The threshold compensation transistors T3 can be thin film transistors of a double-gate structure, the first gates of the threshold compensation transistors T3 may be parts where the scan lines GA overlap the active semiconductor layer 0310, and the second gates of the threshold compensation transistors T3 may be parts where bulges protruding from the scan lines GA overlap the active semiconductor layer 0310. As shown in FIGS. 3 and 4B, the drive gates of the drive transistors T1 may be the second electrodes cc2 of the storage capacitors CST.

It should be noted that the dashed lines in FIG. 4A show parts, overlapping the active semiconductor layer 0310, of the gate conductive layer 0320.

Illustratively, as shown in FIGS. 3 and 4B, the scan line GA, the reset line RST, and the light emitting control line EM are disposed in the second direction F2, and extend substantially in the first direction F1. Illustratively, the scan line GA is located between the reset line RST and the light emitting control line EM in the same row as the scan line GA. Illustratively, FIG. 3 is illustrated merely by way of example with the second direction F2 being the column direction and the first direction F1 being the row direction.

Illustratively, in the second direction F2, the second electrode cc2 of the storage capacitor CST is located between the scan line GA and the light emitting control line EM. Further, the bulges protruding from the scan line GA are located at the side, away from the light emitting control line EM, of the scan line GA.

Figure 4C:
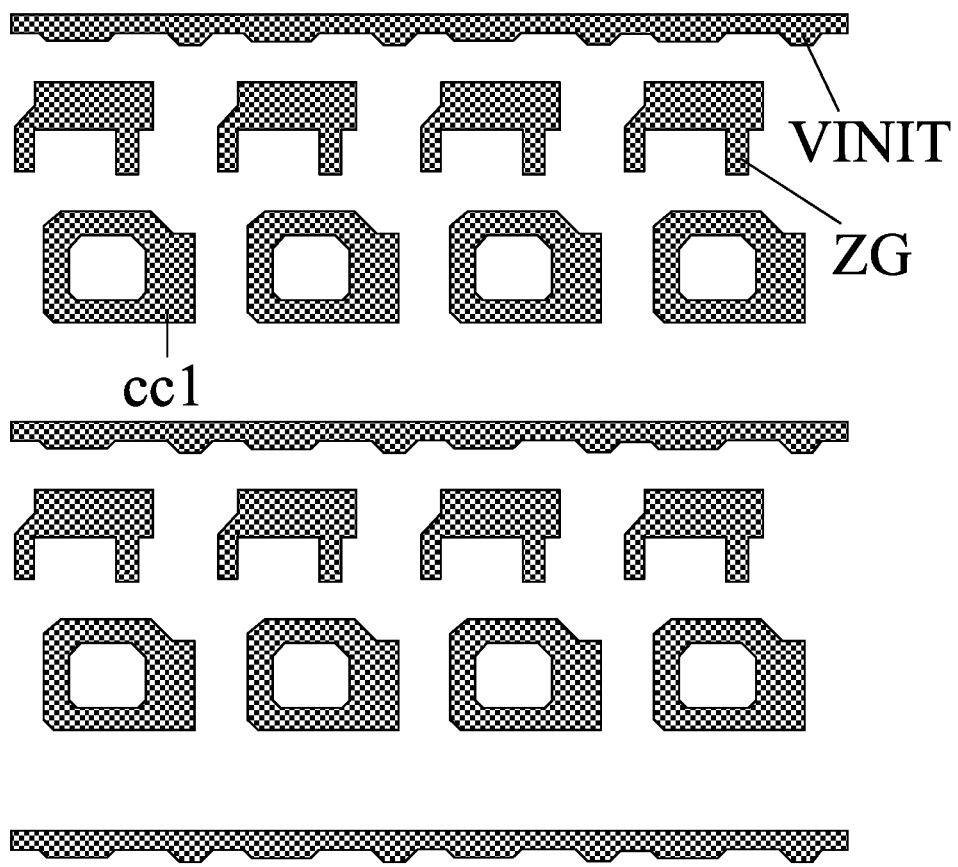
FIG. 4C is a schematic layout structure diagram of a reference conductive layer provided by an embodiment of the disclosure.

Illustratively, an interlayer dielectric layer is formed over the gate conductive layer 0320 to protect the gate conductive layer 0320. FIGS. 3 and 4C show the reference conductive layer 0330 of the pixel circuits 0121. The reference conductive layer 0330 includes the first electrodes cc1 of the storage capacitors CST, the initialization lines VINIT, and light shielding layers ZG. The first electrode cc1 and the second electrode cc2 of the storage capacitor CST at least partially overlap to form the storage capacitor CST. Illustratively, the first electrode cc1 of the storage capacitor CST has a hollowed-out region that may expose a part of the second electrode cc2 of the storage capacitor CST.

Illustratively, as shown in FIGS. 3 and 4C, an orthographic projection of the light shielding layer ZG on the base substrate 10 overlaps an orthographic projection of the source region of the corresponding second reset transistor T7 (e.g., the source region of the second reset transistor T7 is integrated with the source region of the corresponding first reset transistor T6) in the active semiconductor layer 0310 on the base substrate 10. Therefore, the influence of light on the second reset transistors T7 can be reduced, and the reset accuracy may be improved. For example, the threshold compensation transistor T3 is a double-gate transistor. For example, the light shielding layer ZG shields an active layer portion between the two gates of the corresponding threshold compensation transistor T3, and because the threshold compensation transistors T3 are directly connected to the drive transistors T1, a function of stabilizing an operating state of the drive transistors T1 may be realized. For example, a projection of the light shielding layer ZG on the base substrate is located between the data line and the first power supply signal line VDD which are directly electrically connected with the pixel circuit in a pixel circuit region where the light shielding layer ZG is located, thereby realizing an effect of shielding signal interference.

Illustratively, as shown in FIGS. 3 and 4C, the orthographic projection of the light shielding layer ZG on the base substrate 10 overlaps an orthographic projection of the drain region of the corresponding first reset transistor T6 in the active semiconductor layer 0310 on the base substrate 10. Therefore, the influence of light on the first reset transistors T6 may be reduced, and the reset accuracy may be improved.

Illustratively, as shown in FIGS. 3 and 4C, the orthographic projections of the light shielding layers ZG on the base substrate 10 overlap orthographic projections of conductive regions between the active layers T3-A of the threshold compensation transistors T3 in the active semiconductor layer 0310 on the base substrate 10. Therefore, the influence of light on the threshold compensation transistors T3 may be reduced, and the accuracy of threshold compensation may be improved.

Figure 4D:
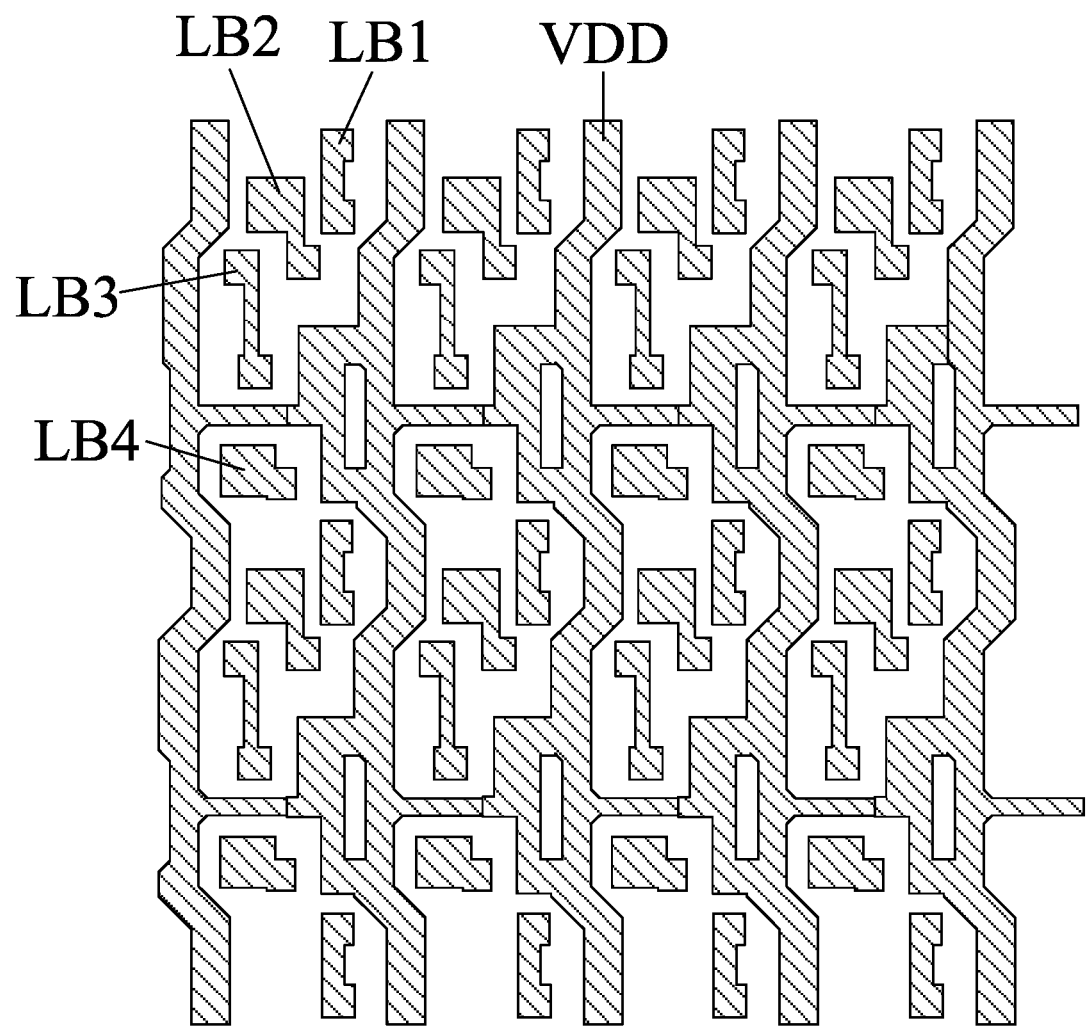
FIG. 4D is a schematic layout structure diagram of a source-drain metal layer provided by an embodiment of the disclosure.

Illustratively, a first interlayer insulating layer is formed over the above-mentioned reference conductive layer 0330 to protect the reference conductive layer 0330. FIGS. 3 and 4D show the source-drain metal layer 0340 of the pixel circuits 0121. The source-drain metal layer 0340 may include the first power supply signal lines VDD, and connection parts LB1, LB2, LB3 and LB4. Illustratively, the first color sub-pixels spx1, the second color sub-pixels spx2, the third color sub-pixels spx3, and the fourth color sub-pixels spx4 include the connection parts LB1, LB2, LB3 and LB4, respectively.

Illustratively, a second interlayer insulating layer is formed over the source-drain metal layer 0340 to protect the source-drain metal layer 0340. FIGS. 3, 4E, 4F and 5A show the first conductive layer 0350 of the pixel circuits 0121. FIG. 4F is an enlarged schematic diagram of the dashed boxes in FIG. 4E. The first conductive layer 0350 includes: signal lines Vd which are disposed in sequence in the first direction F1 and extend toward the second direction F2, and signal line bulges TQ (TQ1/TQ2/TQ3/TQ4) and anode connection parts YZ (YZ1/YZ2/YZ3/YZ4) which are disposed on the same side of the signal lines Vd and are disposed alternately and at intervals. The signal line bulges TQ are integrally connected with the signal lines Vd. Specifically, the signal lines Vd may be configured as data lines Vd that transmit data signals. Illustratively, the first color sub-pixel spx1 may include the signal line bulge TQ1 and the anode connection part YZ1, the second color sub-pixel spx2 may include the signal line bulge TQ2 and the anode connection part YZ2, the third color sub-pixel spx3 may include the signal line bulge TQ3 and the anode connection part YZ3, the fourth color sub-pixel spx4 may include the signal line bulge TQ4 and the anode connection part YZ4, and the anode connection parts YZ are connected with the anodes through insulating layer via holes. Specifically, patterns of overlapping signal line bulges of every two adjacent sub-pixels in a column are different. Specifically, for example, as shown in FIG. 4F, a first signal line bulge TQ1 from the left of a first row and a first signal line bulge TQ5 from the left of a second row are two signal line bulges of two adjacent sub-pixels in a column, the first signal line bulge TQ1 from the left of the first row includes a second bulge connection part TQL1 extending to the right, and the first signal line bulge TQ5 from the left of the second row includes a second bulge connection part TQL5 extending to the left, i.e. the pattern of the first signal line bulge TQ1 from the left of the first row is different from the pattern of the first signal line bulge TQ5 from the left of the second row.

Figure 4E:
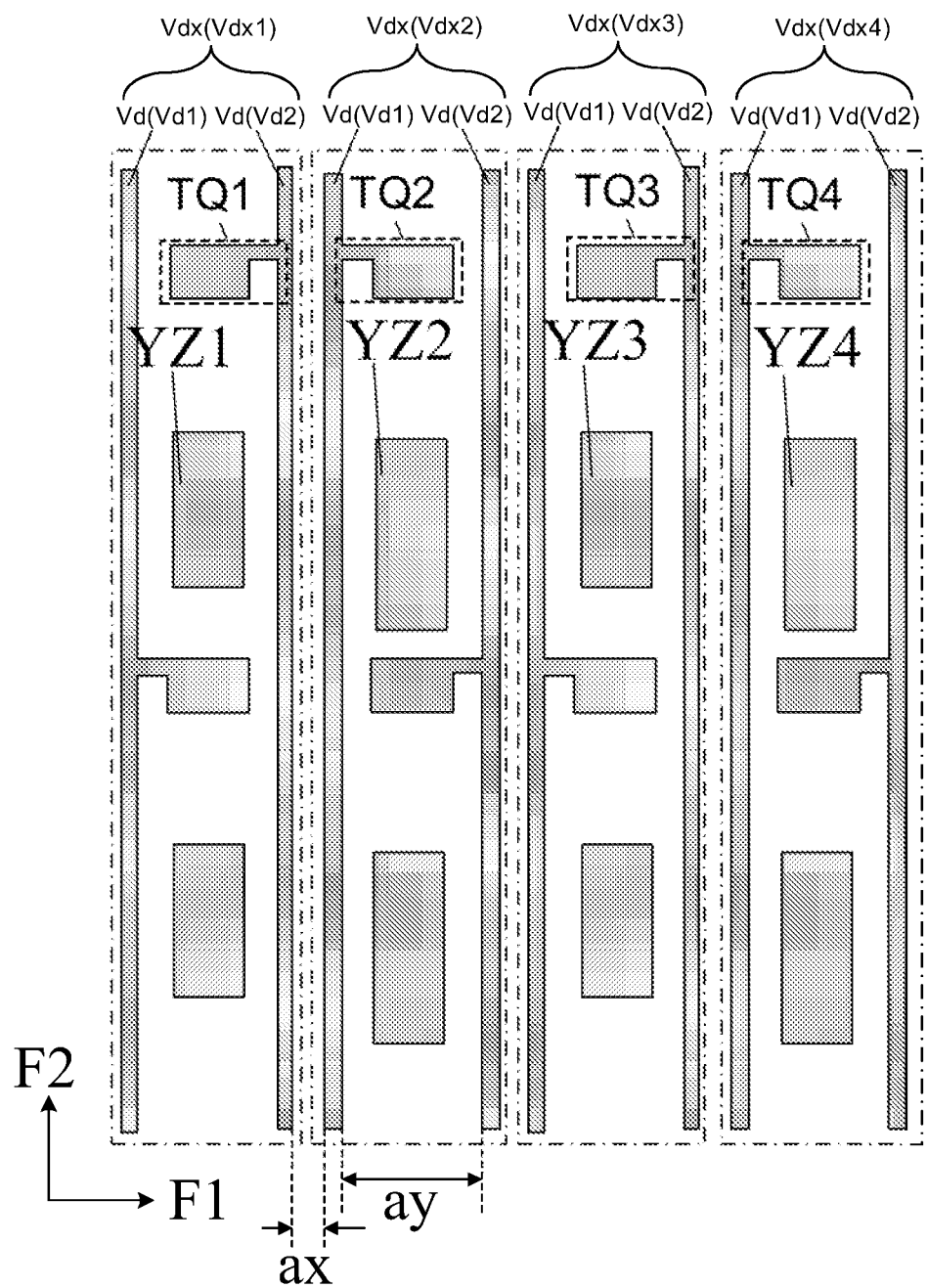
FIG. 4E is a schematic layout structure diagram of a first conductive layer provided by an embodiment of the disclosure.
Figure 4F:
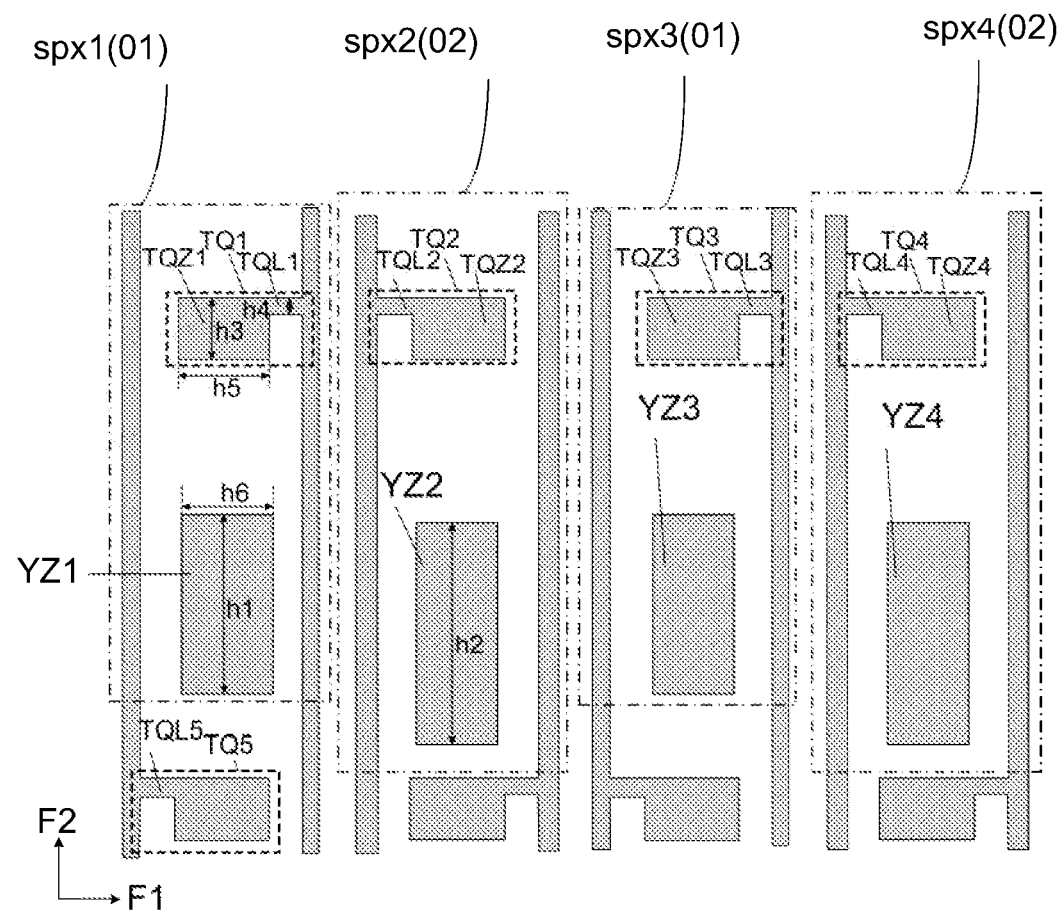
FIG. 4F is a partially enlarged schematic diagram of FIG. 4E.

Illustratively, as shown in FIG. 4E, each signal line Vd further includes a signal line protrusion, and the signal line bulges TQ may specifically have the same structure as the signal line protrusions. The multiple signal lines Vd include first signal lines Vd1 and second signal lines Vd2, and one column of sub-pixels correspond to one first signal line Vd1 and one second signal line Vd2. The signal line protrusions of the first signal lines Vd1 are respectively electrically connected to the sub-pixels in odd-numbered rows, and the signal line protrusions of the second signal lines Vd2 are respectively electrically connected to the sub-pixels in even-numbered rows. In two first signal lines Vd1 and two second signal lines Vd2 corresponding to two adjacent columns of sub-pixels, the two first signal lines Vd1 are adjacent (it can be understood as that there are no other corresponding signal line between the two first signal lines Vd1, for example, there are no other data line between the two adjacent data lines) to form a first signal line group; or the two second signal lines Vd2 are adjacent (it can be understood as that there are no other corresponding signal lines between the two second signal lines Vd2, for example, there are no other data lines between the two adjacent data lines) to form a second signal line group. Specifically, the multiple signal lines Vd are divided into a plurality of signal line groups Vdx (Vdx1/Vdx2/Vdx3/Vdx4), which are arranged periodically. Each signal line group Vdx includes a first signal line Vd1 and a second signal line Vd2 located on both sides of the same column of sub-pixels. For example, the first signal line Vd1 is located on a first side of the column of sub-pixels, and the second signal line Vd2 is located on a second side of the column of sub-pixels. For example, the first side may be a left side and the second side may be a right side; for another example, the first column may be a right side and the second side may be a left side. A spacing of a gap between the adjacent signal line groups may be ax, a spacing of a gap between the first signal line Vd1 and the second signal line Vd2 in the same signal line group may be ay, and ax may be less than ay. For example, ax may be 3-7 microns, and ay may be 12-20 microns. Each column of sub-pixels correspond to the first signal line Vd1 and the second signal line Vd2 of the corresponding signal line group Vdx, for example, a left side and a right side of the pixel circuits of each column of sub-pixels are adjacent to the first signal line Vd1 and the second signal line Vd2, respectively. The first signal lines Vd1 drive the sub-pixels in the odd-numbered rows, and the second signal lines Vd2 drive the sub-pixels in the even-numbered rows. Specifically, the signal line bulges TQ may be the signal line protrusions integrally electrically connected with the data lines Vd, which is beneficial to simplifying the manufacturing process and the wiring complexity of the display substrate. Of course, the signal line bulges may be other structures independent of the signal line protrusions regardless of the manufacturing process difficulty and the wiring complexity of the display substrate. The data lines Vd extend in the second direction F2 and are sequentially disposed in the first direction F1. The signal line protrusions of the first signal lines Vd1 are electrically connected to the sub-pixels in the odd-numbered rows, respectively, and the signal line protrusions of the second signal lines Vd2 are electrically connected to the sub-pixels in the even-numbered rows, respectively.

Figure 4G:
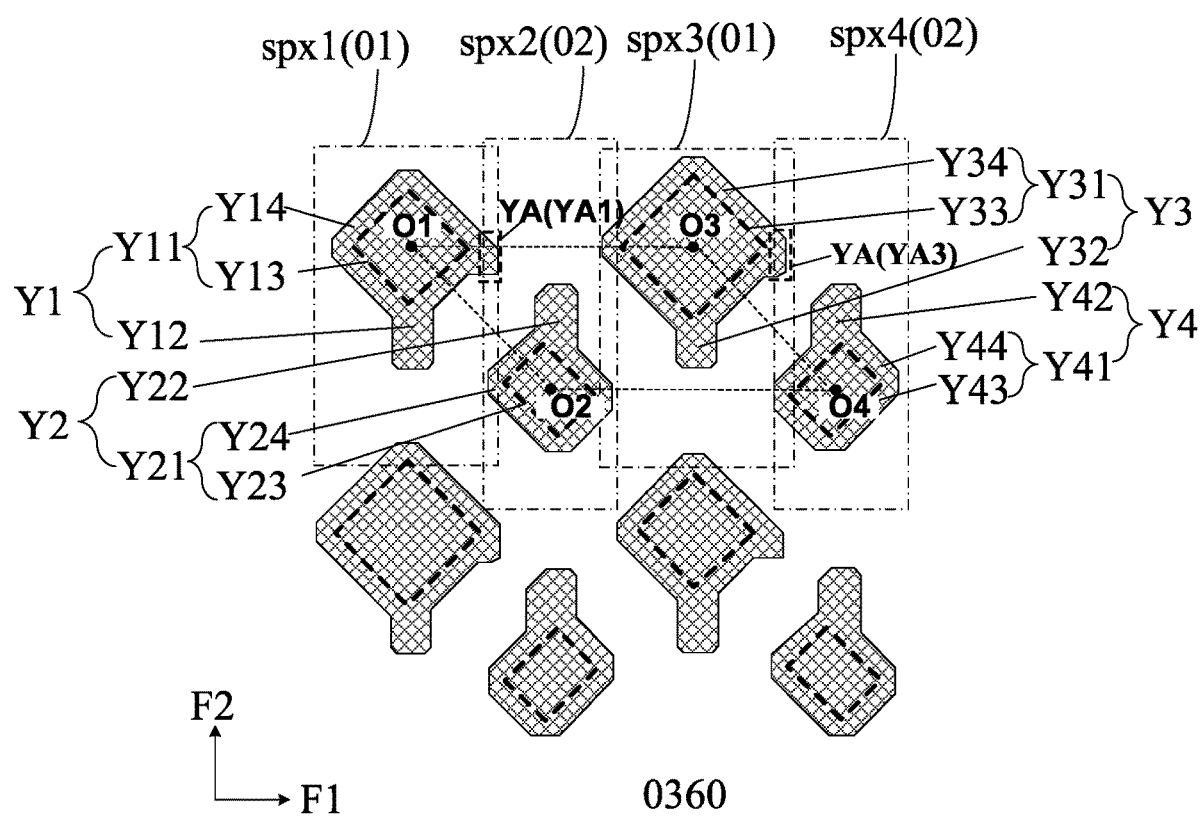
FIG. 4G is a schematic layout structure diagram of an anode layer provided by an embodiment of the disclosure.
Figure 5A:
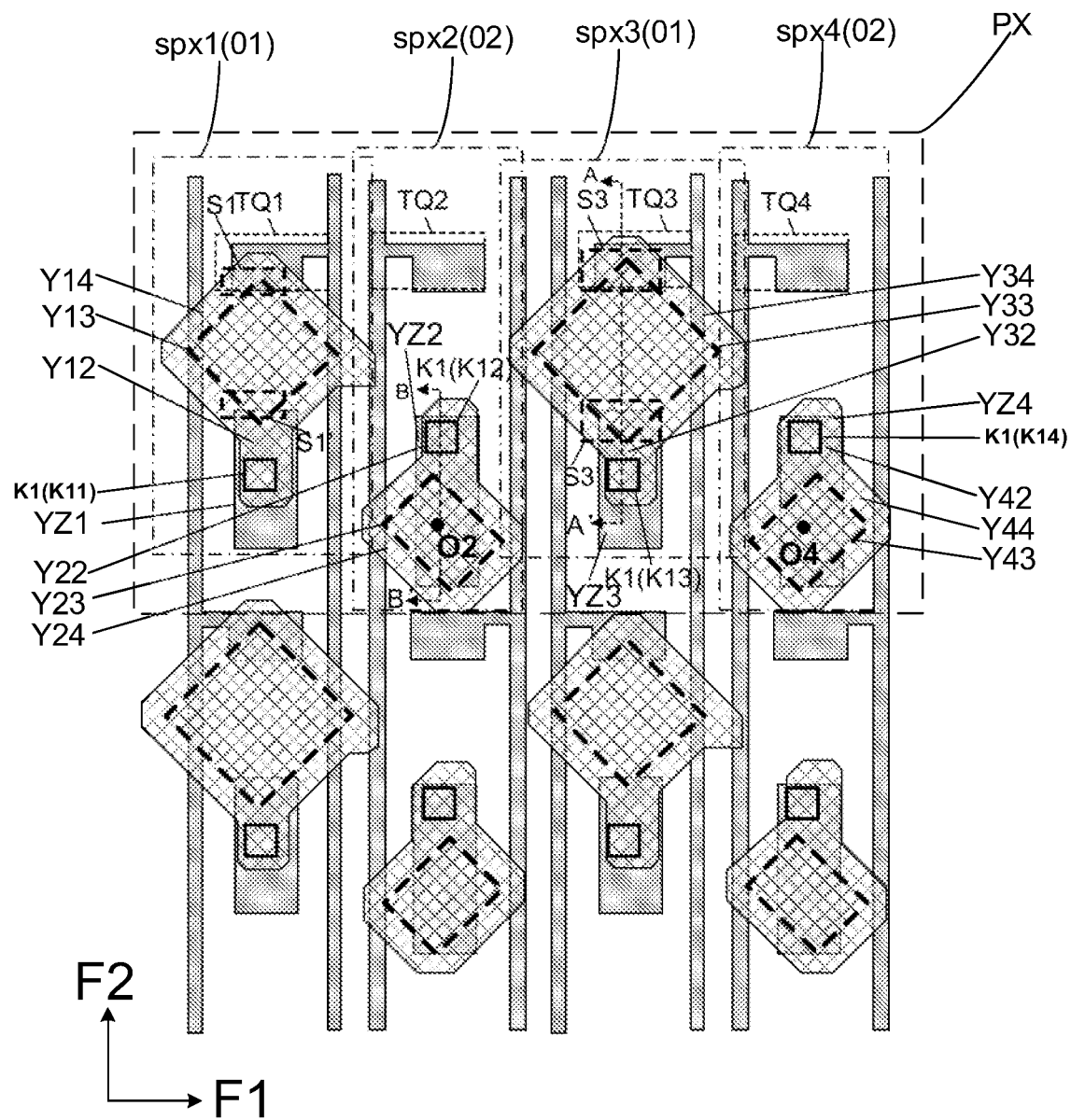
FIG. 5A is a schematic structural diagram of a first conductive layer and an anode layer being laminated provided by an embodiment of the disclosure.

Illustratively, the first insulating layer is formed over the first conductive layer 0350 to protect the first conductive layer 0350. FIGS. 3, 4G, and 5A show an anode layer 0360 located on a side, facing away from the base substrate 10, of the first conductive layer 0350. The anode layer 0360 includes the anodes Y (Y1/Y2/Y3/Y4). Illustratively, the first color sub-pixels spx1 may include the anodes Y1, the second color sub-pixels spx2 may include the anodes Y2, the third color sub-pixels spx3 may include the anodes Y3, and the fourth color sub-pixels spx4 may include the anodes Y4.

As shown in FIGS. 3 to 4F, the first power signal lines VDD are electrically connected to the source regions of the first light emitting control transistors T4 in the active semiconductor layer 0310 through at least one via hole penetrating the gate insulating layer, the interlayer dielectric layer, and the first interlayer insulating layer. The first power signal lines VDD are electrically connected to the first electrodes cc1 of the storage capacitors CST in the reference conductive layer 0330 through at least one via hole penetrating the first interlayer insulating layer. The first power signal lines VDD are further electrically connected to the light shielding layers ZG through at least one via hole penetrating the first interlayer insulating layer.

As shown in FIGS. 3 to 4F, one ends of the connection parts LB1 are electrically connected to the drain regions of the threshold compensation transistors T3 in the active semiconductor layer 0310 through at least one via hole penetrating the gate insulating layer, the interlayer dielectric layer, and the first interlayer insulating layer. The other ends of the connection parts LB1 are electrically connected with the initialization lines VINIT through at least one via hole penetrating the first interlayer insulating layer.

Figure 4H:
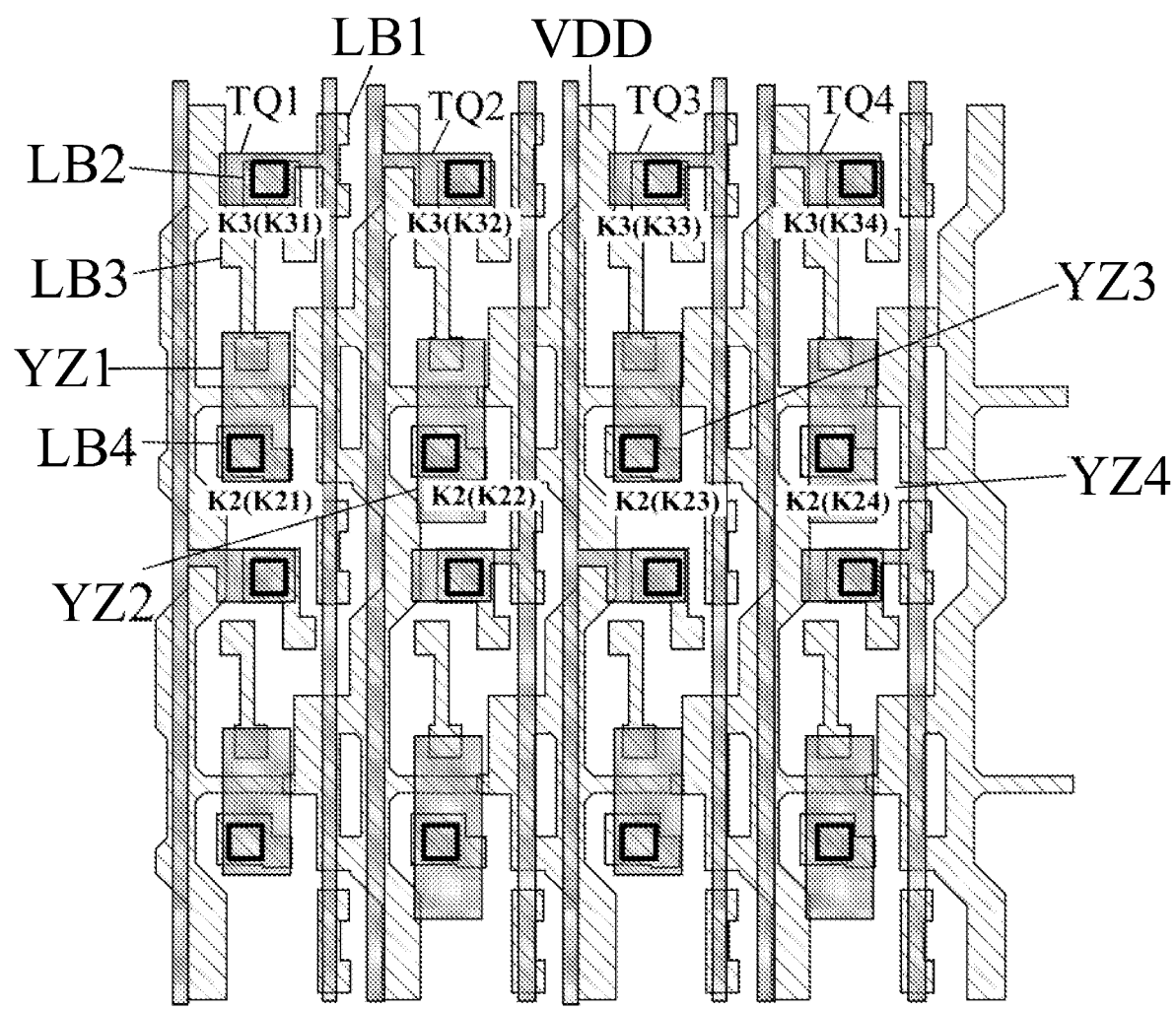
FIG. 4H is a schematic layout structure diagram of a source-drain metal layer and a first conductive layer being laminated provided by an embodiment of the disclosure.

As shown in FIGS. 3 to 4H, one ends of the connection parts LB2 are electrically connected to the signal line bulges TQ (TQ1/TQ2/TQ3/TQ4) through third via holes K3 (K31/K32/K33/K34) penetrating through the second interlayer insulating layer, and the other ends of the connection parts LB2 are electrically connected to the source regions of the data writing transistors T2 in the active semiconductor layer 0310 through at least one via hole penetrating the gate insulating layer, the interlayer dielectric layer and the first interlayer insulating layer.

As shown in FIGS. 3 to 4F, one ends of the connection parts LB3 are electrically connected to the second electrodes cc2 of the storage capacitors CST through at least one via hole penetrating the interlayer dielectric layer and the first interlayer insulating layer. The other ends of the connection parts LB3 are electrically connected to the drain regions of the first reset transistors T6 in the active semiconductor layer 0310 through at least one via hole penetrating the gate insulating layer, the interlayer dielectric layer, and the first interlayer insulating layer.

As shown in FIGS. 3 to 4F, the connection parts LB4 are electrically connected to the drain regions of the second light emitting control transistors T5 in the active semiconductor layer 0310 through at least one via hole penetrating the gate insulating layer, the interlayer dielectric layer, and the first interlayer insulating layer.

In some examples, as shown in FIGS. 3-5A and 6A, the first insulating layer J11 includes first via holes K1 (K11/K12/K13/K14) exposing parts of the anode connection parts YZ. Each anode Y includes a main part and an auxiliary part electrically connected to each other. Each main part may include an effective part exposed by a corresponding sub-pixel opening of a subsequently formed pixel defining layer, and an anode extension extending from the effective part. Each auxiliary part extends from the anode extension to one side of the corresponding anode connection part in the second direction. An outer contour shape of the anode extension is similar to an outer contour shape of the effective part. The auxiliary parts are electrically connected to the anode connection parts YZ through the first via holes K1. For example, in the first color sub-pixels spx1, the anodes Y1 include main parts Y11 and auxiliary parts Y12 electrically connected to each other, the main parts Y11 include effective parts Y13 and anode extensions Y14, the auxiliary parts Y12 are electrically connected to the anode connection parts YZ1 through the first via holes K11, and the anode connection parts YZ1 are electrically connected to the corresponding connection parts LB4 through second via holes K21 penetrating the second interlayer insulating layer. In the second color sub-pixels spx2, the anodes Y2 include main parts Y21 and auxiliary parts Y22 electrically connected to each other, the main parts Y21 include effective parts Y23 and anode extensions Y24, the auxiliary parts Y22 are electrically connected with the anode connection parts YZ2 through the first via holes K12, and the anode connection parts YZ2 are electrically connected to the corresponding connection parts LB4 through second via holes K22 penetrating through the second interlayer insulating layer. In the third color sub-pixels spx3, the anodes Y3 include main parts Y31 and auxiliary parts Y32 electrically connected to each other, the main parts Y31 include effective parts Y33 and anode extensions Y34, the auxiliary parts Y32 are electrically connected with the anode connection parts YZ3 through the first via holes K13, and the anode connection parts YZ3 are electrically connected with the corresponding connection parts LB4 through second via holes K23 penetrating through the second interlayer insulating layer. In the fourth color sub-pixels spx4, the anodes Y4 include main parts Y41 and auxiliary parts Y42 electrically connected to each other, the main parts Y41 include effective parts Y43 and anode expansion parts Y44, the auxiliary parts Y42 are electrically connected with the anode connection parts YZ4 through first via holes K14, and the anode connection parts YZ4 are electrically connected with the corresponding connection parts LB4 through second via holes K24 penetrating through the second interlayer insulating layer. In some examples, as shown FIG. 4G, in the same repeating unit, a center O1 of the effective part Y13 of the first color sub-pixel spx1, a center O2 of the effective part Y23 of the second color sub-pixel spx2, a center O3 of the effective part Y33 of the third color sub-pixel spx3, and a center O4 of the effective part Y43 of the fourth color sub-pixel spx4 substantially enclose a quadrangle, for example, a parallelogram. For example, the center O1 of the effective part Y13 of the first color sub-pixel spx1 and the center O3 of the effective part Y33 of the third color sub-pixel spx3 are located at two adjacent vertices of the quadrangle, and a connecting line of the two centers is perpendicular to the second direction F2. For example, the center O2 of the effective part Y23 of the second color sub-pixel spx2 and the center O4 of the effective part Y43 of the fourth color sub-pixel spx4 are located at the other two adjacent vertices of the quadrangle, and a connecting line of the two centers is perpendicular to the second direction F2. For example, a midperpendicular of the connecting line of the center O1 of the effective part Y13 of the first color sub-pixel spx1 and the center O3 of the effective part Y33 of the third color sub-pixel spx3 may pass through the effective part Y23 of the second color sub-pixel spx2, for example, may pass through the center O2 of the effective part Y23 of the second color sub-pixel spx2. For example, a midperpendicular of the connecting line of the center O2 of the effective part Y23 of the second color sub-pixel spx2 and the center O4 of the effective part Y43 of the fourth color sub-pixel spx4 may pass through the effective part Y33 of the third color sub-pixel spx3, for example, may pass through the center O3 of the effective part Y33 of the third color sub-pixel spx3.

In some examples, as shown in FIGS. 4G and 4A, in each first sub-pixel, an anode shield is further located on a side, facing the corresponding second sub-pixel, of the anode extension, and an orthographic projection of the anode shield on the base substrate covers a corresponding first region. The first region includes at least part of a region between the two channel regions of the threshold compensation transistor in the pixel circuit corresponding to the second sub-pixel, for example, more than half. For example, in the first color sub-pixel spx1, an anode shield YA1 is located on a side, facing the corresponding second color sub-pixel spx2, of the anode extension Y14, an orthographic projection of the anode shield YA1 on the base substrate 10 covers an orthographic projection of the first region in the active semiconductor layer 0310 of the adjacent second color sub-pixel spx2 in the same sub-pixel on the base substrate 10. The first region includes at least part of a region between the two channel regions T3-A of the threshold compensation transistor T3 in the pixel circuit corresponding to the second color sub-pixel spx2. For another example, in the third color sub-pixel spx3, an anode shield YA3 is located on a side, facing the corresponding fourth color sub-pixel spx4, of the anode extension Y34, an orthographic projection of the anode shield YA3 on the base substrate 10 covers an orthographic projection of the first region in the active semiconductor layer 0310 of the adjacent fourth color sub-pixel spx4 in the same sub-pixel on the base substrate 10. The first region includes at least part of a region between the two channel regions T3-A of the threshold compensation transistor T3 in the pixel circuit corresponding to the fourth color sub-pixel spx4.

It should be noted that the main part and the auxiliary part which are electrically connected to each other in the anode are integrated, i.e. the main part and the auxiliary part are formed continuously.

Figure 6A:
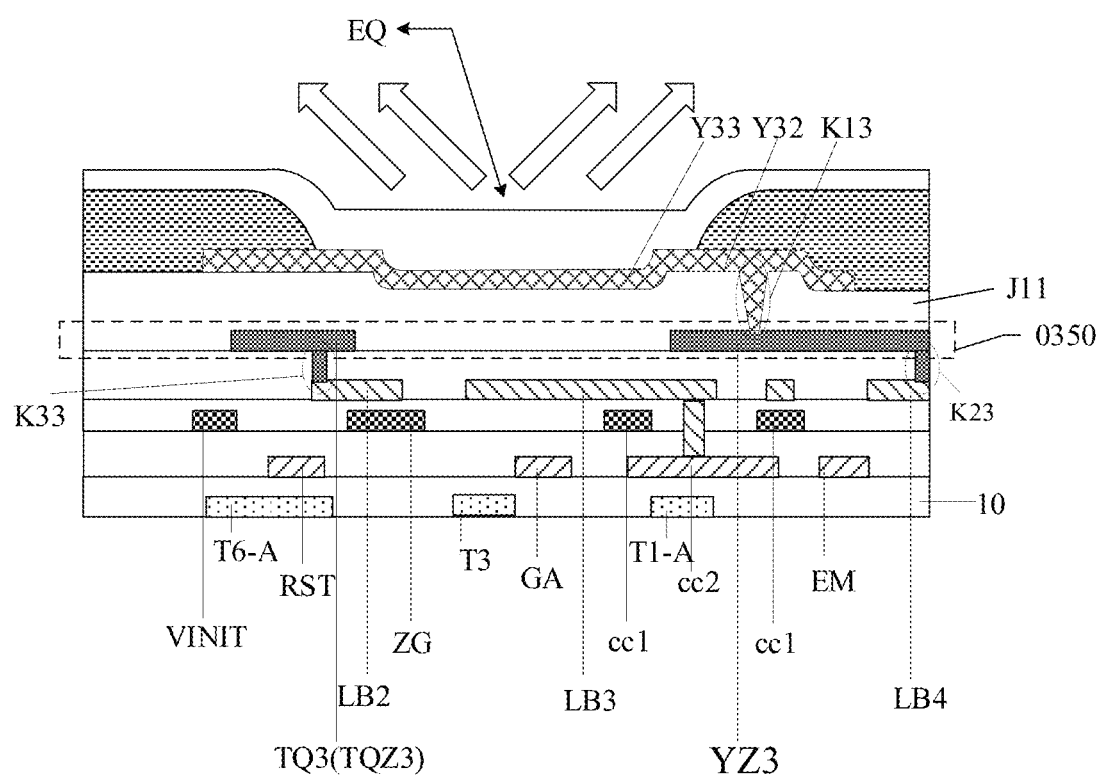
FIG. 6A is a schematic cross-sectional structure diagram in a direction AA' in the schematic layout structure diagram shown in FIG. 5A.

In some examples, as shown in FIG. 5A and FIG. 6A, the pixel defining layer is formed on a side, facing away from the base substrate 10, of the anode layer, and includes the multiple sub-pixel openings in one-to-one correspondence to the sub-pixels. For example, the effective parts of at least part of the sub-pixels have overlapping regions with both the signal line bulges TQ and the anode connection parts YZ connected to the corresponding pixel circuits in the second direction F2, i.e., a straight line parallel to the second direction F2 may simultaneously pass through the signal line bulge(s) TQ and the anode connection part(s) YZ. For example, a straight line parallel to the second direction F2 may pass through the signal line bulges TQ and the anode connection parts YZ of all the sub-pixels of the same column, and the signal line bulges TQ and the anode connection parts YZ through which the straight line passes are alternately distributed in the second direction F2. For example, the effective part Y13 of the first color sub-pixel spx1 has a first overlapping region S1 with the signal line bulge TQ1 connected with the corresponding pixel circuit, and has a second overlapping region S1' with the anode connection part YZ1 connected to the corresponding pixel circuit. For example, the effective part Y33 of the third color sub-pixel spx3 has a first overlapping region S3 with the signal line bulge TQ3 connected with the corresponding pixel circuit, and has a second overlapping region S3' with the anode connection part YZ3 connected to the corresponding pixel circuit. According to the embodiments of the present disclosure, the effective parts of at least part of the sub-pixels have the overlapping regions with the signal line bulges TQ and the anode connection parts YZ connected with the corresponding pixel circuits in the second direction, thereby solving the problem that if the effective parts of the anodes Y merely overlap the anode connection parts YZ, ends, corresponding to the anode connection parts YZ, of the effective parts may be relatively high and color shift occurs.

In a specific implementation, the effective parts, exposed by the sub-pixel openings, of the anodes may be in contact with the subsequently formed light-emitting layers so as to define a light-emitting region of each sub-pixel. A region, other than the sub-pixel opening, of the pixel defining layer can be a covering part covering the anodes and other regions other than the region where the anodes are located, and a pattern of the pixel defining layer is simple and may be consistent with a pattern of a pixel defining layer of a conventional display substrate, which is not shown in the embodiments of the present disclosure any more.

In some examples, as shown in FIG. 5A, the plurality of sub-pixels are divided into first sub-pixels 01 and second sub-pixels 02, and areas of anodes of the first sub-pixels 01 are greater than areas of anodes of the second sub-pixels 02. Effective parts of the first sub-pixels 01 have overlapping regions with both the signal line bulges TQ and the anode connection parts YZ connected to the corresponding pixel circuits in the second direction F2. An orthographic projection of an anode connection part YZ of each second sub-pixel 02 on the base substrate 10 passes through an orthographic projection of an effective part on the base substrate 10, for example, through a center of the orthographic projection of the effective part on the base substrate 10. Specifically, for example, each first sub-pixel 01 may include a first color sub-pixel spx1 and a third color sub-pixel spx3, each second sub-pixel 02 may include a second color sub-pixel and a fourth color sub-pixel spx4, the first color sub-pixels spx1 may specifically be red sub-pixels, the third color sub-pixels spx1 may specifically be blue sub-pixels, and the second color sub-pixels spx2 and the fourth color sub-pixels spx4 may specifically be green sub-pixels. Specifically, for example, the effective part Y13 of the first color sub-pixel spx1 has an overlapping region with both the signal line bulge TQ1 and the anode connection part YZ1 connected to the corresponding pixel circuit in the second direction F2. For example, the effective part Y33 of the third color sub-pixel spx3 has an overlapping region with both the signal line bulge TQ3 and the anode connection part YZ3 connected to the corresponding pixel circuit in the second direction F2. For example, an orthographic projection of the anode connection part YZ2 of the second color sub-pixel spx2 on the base substrate 10 covers an orthographic projection of the effective part Y23 on the base substrate 10, for example, covering a center O2 of the orthographic projection of the effective part Y23 on the base substrate 10. For example, an orthographic projection of the anode connection part YZ4 of the fourth color sub-pixel spx4 on the base substrate 10 covers an orthographic projection of the effective part Y43 on the base substrate 10, for example, covering a center O4 of the orthographic projection of the effective part Y43 on the base substrate 10. In the embodiments of the present disclosure, since the overlapping region between the anode connection part YZ and the effective part of each first sub-pixel 01 is small, and the overlapping region between the anode connection part YZ and the effective part of each second sub-pixel 02 is generally large (an area occupied by a hole, communicating to the source-drain metal layer 0340, of the anode connection part YZ of the second sub-pixel 02 is closer to the center of the effective part), color shift of the first sub-pixels 01 and the second sub-pixels 02 may be avoided by enabling the effective parts of the first sub-pixels 01 to overlap the signal line bulges TQ and the anode connection parts YZ in the second direction F2, and enabling the orthographic projection of the anode connection part YZ of each second sub-pixel 02 to cover the orthographic projection of the effective part on the base substrate 10, for example, covering the center of the orthographic projection of the effective part on the substrate 10.

Figure 6B:
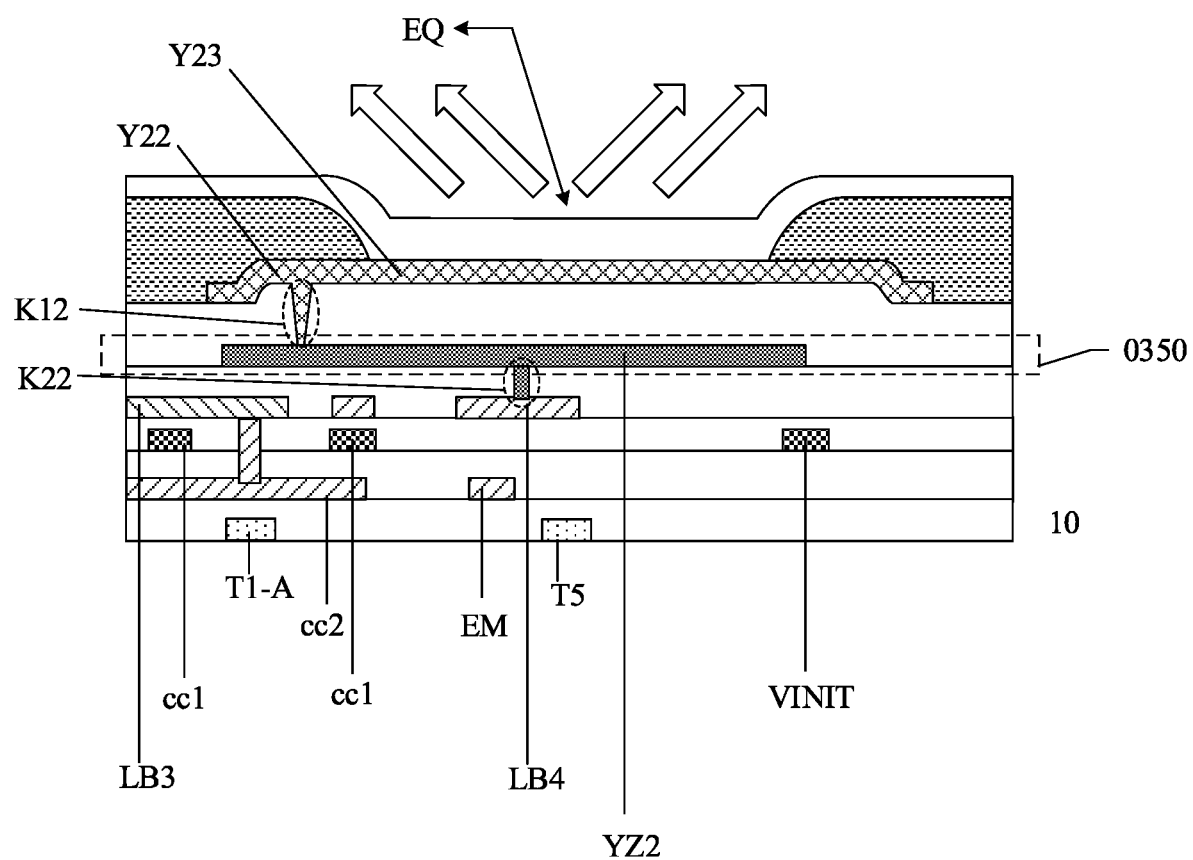
FIG. 6B is a schematic cross-sectional structure diagram in a direction BB' in the schematic layout structure diagram shown in FIG. 5A.

In a specific implementation, as shown in FIGS. 5A and 6B, the orthographic projection of the anode connection part YZ of each second sub-pixel 02 on the base substrate 10 covers the center of the orthographic projection of the effective part on the base substrate 10, and covers more than 60%, alternatively, more than 70%, alternatively more than 80%, of the orthographic projection of the effective part on the base substrate 10. For example, as shown in FIG. 5A, the orthographic projection of the anode connection part YZ2 of the second color sub-pixel spx2 on the base substrate 10 covers the center O2 of the orthographic projection of the effective part Y23 on the base substrate 10, and covers more than 60%, alternatively, more than 70%, alternatively more than 80%, of the orthographic projection of the effective part Y23 on the base substrate 10. For example, the orthographic projection of the anode connection part YZ of each second sub-pixel 02 on the base substrate 10 passes through a majority of the region of the orthographic projection of the effective part on the base substrate 10, for example, more than 60%, alternatively, more than 70%, alternatively, more than 80%. For example, the orthographic projection of the anode connection part of each second sub-pixel on the base substrate may also pass through the entirety of the orthographic projection of the effective part on the base substrate. For example, the anode connection parts YZ extend in the second direction F2, and the orthographic projection of the anode connection part YZ of each second sub-pixel 02 on the base substrate 10 covers the center of the orthographic projection of the effective part on the base substrate 10. For example, the orthographic projection of the anode connection part YZ of each second sub-pixel 02 on the base substrate 10 passes through the center of the orthographic projection of the effective part on the base substrate 10 in the second direction F2.

Figure 5B:
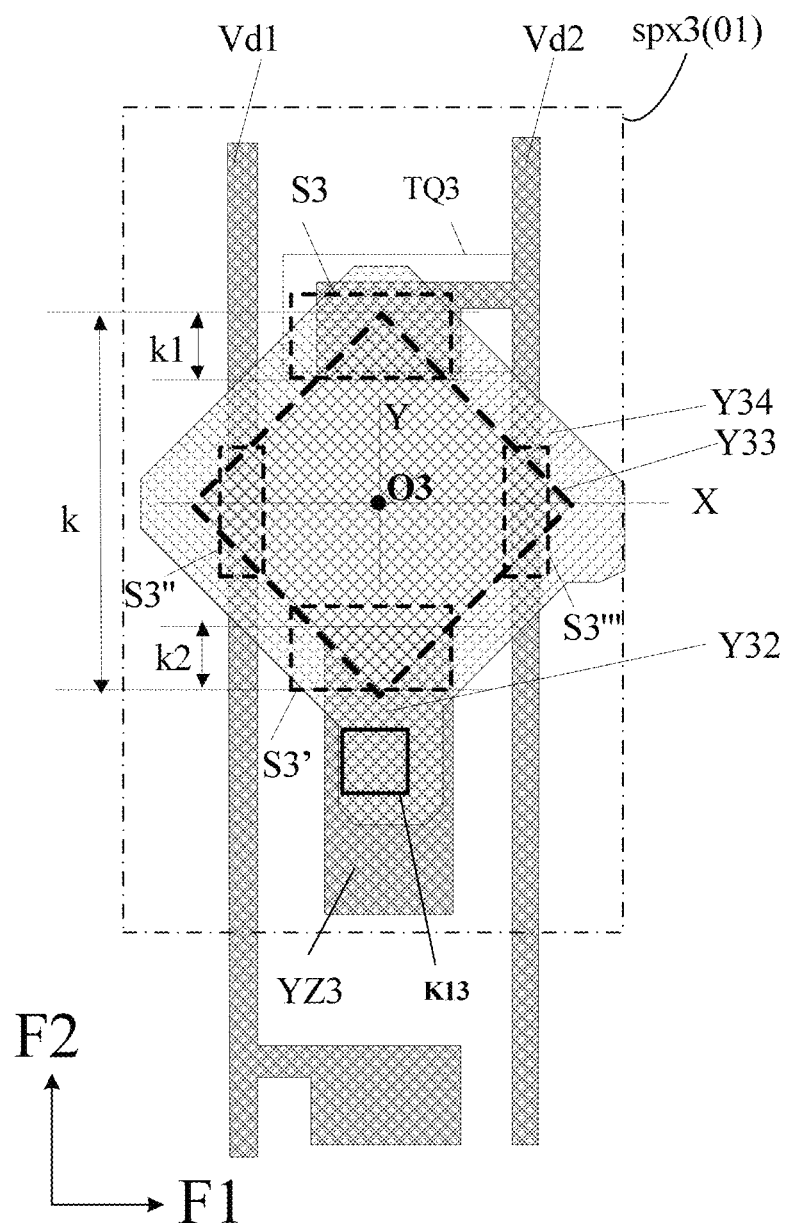
FIG. 5B is an enlarged schematic structural diagram of a third color sub-pixel in FIG. 5A.

In some examples, as shown in FIG. 5A, the first overlapping regions and the second overlapping regions are similar in shape and have the same area. Specifically, as shown in FIG. 5B, which is an enlarged schematic diagram of one first sub-pixel 01 (one third color sub-pixel spx3) in FIG. 5A, the maximum length of the first overlapping region in the second direction is one tenth to one third of the maximum length of the effective part in the second direction. For example, the maximum length of the second overlapping region in the second direction is one tenth to one third of the maximum length of the effective part in the second direction. For example, in the third color sub-pixel spx3, the maximum length k1 of the first overlapping region S1 in the second direction F2 is one tenth to one third of the maximum length k of the effective part Y33 in the second direction F2, and the maximum length k2 of the second overlapping region S3' in the second direction F2 is one tenth to one third of the maximum length k of the effective part Y33 in the second direction F2. Further, the first overlapping region and the second overlapping region are symmetrical with respect to a straight line passing through the center of the effective part and perpendicular to the second direction. For example, in the third sub-pixel spx3, the first overlapping region S3 and the second overlapping region S3' are symmetrical with respect to a line X passing through the center O3 of the effective part Y33 and perpendicular to the second direction F2. In the embodiments of the present disclosure, because the first overlapping region and the second overlapping region are symmetrical with respect to the straight line passing through the center of the effective part and perpendicular to the second direction, the color shift problem of the first sub-pixel can be effectively solved. Of course, it will be appreciated that in specific implementations, it will be more technically difficult to achieve complete precise symmetry of the first overlapping region and the second overlapping region with respect to the line passing through the center of the effective part and perpendicular to the second direction, and therefore, the symmetry of the first overlapping region and the second overlapping region with respect to the line passing through the center of the effective part and perpendicular to the second direction in the embodiments of the present disclosures may be understood as substantial symmetry.

In some examples, as shown in FIG. 4F, a length h2 of the anode connection part YZ of the second sub-pixel 02 in the second direction F2 is greater than a length h1 of the anode connection part YZ of the first sub-pixel 01 in the second direction F2. For example, a length h2 of the anode connection part YZ2 of the second color sub-pixel spx2 in the second direction F2 is larger than a length h1 of the anode connection part YZ1 of the first color sub-pixel spx1 in the second direction F2. In the embodiments of the present disclosure, the length of the anode connection part YZ of each second sub-pixel 02 in the second direction F2 is set to be longer, so that the flatness under the effective part of each anode may be compensated by the anode connection part YZ of the corresponding second sub-pixel 02.

In some examples, as shown in FIG. 4F, each signal line bulge TQ (TQ1/TQ2/TQ3/TQ4) includes: a first bulge connection part TQZ (TQZ1/TQZ2/TQZ3/TQZ4), and a second bulge connection part TQL (TQL1/TQL2/TQL3/TQL4) for connecting the first bulge connection part TQZ with the corresponding signal line Vd. For example, a length h3 of each first bulge connection part TQZ in the second direction F2 is greater than a length h4 of the corresponding second bulge connection part TQL in the second direction F2. In the embodiments of the present disclosure, by setting the first bulge connection parts TQZ (TQZ1/TQZ2/TQZ3/TQZ4) to be longer in the second direction F2, it is further achieved that the first bulge connection parts TQZ (TQZ1/TQZ2/TQZ3/TQZ4) and the effective parts of the anodes overlap more, thereby solving the color shift problem.

In some examples, as shown in FIG. 4F, a length h5 of the first bulge connection part TQZ (TQZ1/TQZ2/TQZ3/TQZ4) in the first direction F1 is substantially the same as a length h6 of the anode connection part YZ (YZ1/YZ2/YZ3/YZ4) in the first direction F1. For example, a ratio of the length h5 of the first bulge connection part TQZ (TQZ1/TQZ2/TQZ3/TQZ4) in the first direction F1 to the length h6 of the anode connection part YZ (YZ1/YZ2/YZ3/YZ4) in the first direction F1 is approximately 0.8-1.2. In the embodiments of the present disclosure, by making the first bulge connection part TQZ TQZ1/TQZ2/TQZ3/TQZ4) and the anode connection part YZ (YZ1/YZ2/YZ3/YZ4) have the same length in the first direction F1, the overlapping area of the effective part of the anode and the first bulge connection part TQZ (TQZ1/TQZ2/TQZ3/TQZ4) is approximately the same as the overlapping area of the effective part of the anode and the anode connection part YZ (YZ1/YZ2/YZ3/YZ4). For example, the ratio of the overlapping area of the effective part of the anode and the first bulge connection part TQZ (TQZ1/TQZ2/TQZ3/TQZ4) to the overlapping area of the effective part of the anode and the anode connection part YZ (YZ1/YZ2/YZ3/YZ4) is approximately 0.8-1.2.

In some examples, as shown in FIG. 4F, in the same sub-pixel, the length h3 of the first bulge connection part TQZ (TQZ1/TQZ2/TQZ3/TQZ4) in the second direction F2 is smaller than the length h1 of the anode connection part YZ (YZ1/YZ2/YZ3/YZ4) in the second direction F2. For example, in each first color sub-pixel, the length h3 of the first bulge connection part TQZ1 in the second direction F2 is smaller than the length h1 of the anode connection part YZ1 in the second direction F2. In the embodiments of the present disclosure, that the length h3 of the first bulge connection part TQZ (TQZ1/TQZ2/TQZ3/TQZ4) in the second direction F2 is smaller than the length h1 of the anode connection part YZ (YZ1/YZ2/YZ3/YZ4) in the second direction F2 is beneficial to realizing conduction with other film layers through via holes by the anode connection part YZ (YZ1/YZ2/YZ3/YZ4). The length h3 of the first bulge connection part TQZ (TQZ1/TQZ2/TQZ3/TQZ4) in the second direction F2 is less than 15 microns, for example, h3 is less than 12 microns, for another example, h3 is greater than 6 microns; h4 is less than 5 microns, for example, h4 is less than 4 microns; and h5 is greater than half a spacing between two signal lines on both sides of the adjacent first bulge connection parts, for example, h5 is 8-20 microns, for another example, h5 is 10-15 microns. Since the first bulge connection parts are used for electrical connection of the signal lines to the other film layers generally through via holes, that is, the first bulge connection parts are provided with via holes, integrally connected to the first bulge connection parts, for connection of the signal lines with the other film layers, the corresponding dimensions h3 and h5 may not be too small, and may be at least larger than dimensions of the via holes. The dimension of a via hole is, for example, 4*4 microns, or, for another example, 3*3 microns, or a via hole may be, for example, circular and has a diameter of 2-4 microns. For example, the data signals for each sub-pixel display are transmitted on the first bulge connection parts, and h3 and h5 cannot be excessively large in order to reduce interference with other signals. For example, in the first direction, the first bulge connection part has a spacing from the other adjacent signal line, such as a data line, the spacing is, for example, approximately equal to h4, or a ratio of the spacing and h4 is approximately 0.8-1.2. For example, the anode connection part YZ also has spacings from the two adjacent signal lines on both sides of the anode connection part YZ in the first direction, the left spacing and the right spacing are approximately equal, for example, approximately equal to h4, or a ratio of each spacing to h4 is approximately 0.8-1.2. A spacing between the anode connection part YZ and the adjacent signal line on the left is, for example, less than 5 microns, and is, for another example, less than 4 microns. A spacing between the anode connection part YZ and the adjacent signal line on the right is, for example, less than 5 microns, and is, for another example, less than 4 microns.

In some examples, as shown in FIG. 4F, the first bulge connection parts TQZ (TQZ1/TQZ2/TQZ3/TQZ4) and the anode connection parts YZ (YZ1/YZ2/YZ3/YZ4) are in a similar shape, specifically, rectangular. In the embodiments of the present disclosure, since the first bulge connection parts TQZ (TQZ1/TQZ2/TQZ3/TQZ4) and the anode connection parts YZ (YZ1/YZ2/YZ3/YZ4) are in the similar shape, the overlapping areas of the effective parts of the anodes and the first bulge connection parts TQZ (TQZ1/TQZ2/TQZ3/TQZ4) are approximately the same as the overlapping areas of the effective parts of the anodes and the anode connection parts YZ (YZ1/YZ2/YZ3/YZ4).

In some examples, shown in FIG. 4G or FIG. 5A, the effective parts of the first sub-pixels are diamond-shaped, e.g., square. For example, the effective part Y13 of the first color sub-pixel spx1 is diamond-shaped, e.g., square. For example, the effective part Y33 of the third color sub-pixel spx3 is diamond-shaped, e.g., square. One of the diagonals of the diamond is parallel to the second direction F2. For example, in FIG. 5A, the vertical diagonal of the first color sub-pixel spx1 is parallel to the second direction F2. For example, an overlapping region of the effective part and the first bulge connection part of each first sub-pixel is substantially a triangular region, corresponding to one corner of the diamond. For example, the overlapping region of the effective part and the anode connection part of each first sub-pixel is substantially a triangular area, corresponding to one corner of the diamond. For example, the overlapping region of the effective part and the first bulge connection part of each first sub-pixel, and the overlapping region of the effective part and the anode connection part of the first sub-pixel respectively correspond to two opposite corners of the diamond. For example, as shown in FIG. 5A, the overlapping region of the effective part Y13 and the first bulge connection part TQZ1 of the first color sub-pixel spx1 is a substantially triangular region. For example, the overlapping region of the effective part Y13 and the anode connection part YZ1 of the first color sub-pixel spx1 is a substantially triangular region. In some examples, as shown in FIG. 4G or FIG. 5A, the effective part of each second sub-pixel 02 has a quadrangular shape, for example, a rounded quadrangular shape, and as shown in FIG. 5A, in the column direction, a dimension of a portion, overlapping the corresponding anode connection part YZ, of the effective part Y23 accounts for 50-100% of the dimension of the effective part Y23, that is, the anode connection part YZ passes through most of the effective part Y23, specifically, 60-90%, more specifically, 70-80%, and more specifically, 80%. For example, the orthographic projection of the anode connection part on the base substrate passes through an orthographic projection of two diagonal regions of the effective part of each second sub-pixel on the base substrate. For example, the effective part Y23 of the second color sub-pixel spx2 has a quadrangle shape, for example, a rounded quadrangle. For example, the orthographic projection of the anode connection part YZ2 on the base substrate 10 passes through the orthographic projection of the upper and lower diagonal regions of the effective part Y23 of the second color sub-pixel spx2 on the base substrate 10. In a specific implementation, due to practical process constraints, corners of the effective part of the quadrangle of each second sub-pixel 02 may further adopt non-square transition, for example, arc transition.

In some examples, as shown in FIG. 4E or 4F, in the same sub-pixel 01, a side edge, away from the anode connection part YZ, of the first bulge connection part TQZ is in the same straight line as a side edge, away from the anode connection part YZ, of the second bulge connection part TQL, that is, in the first sub-pixel 01, sides, away from the anode connection parts YZ, of the signal line bulges TQZ are flush, and in the second sub-pixel, sides, away from the anode connection parts YZ, of the signal line bulges TQZ are flush.

In some examples, as shown in FIG. 5A, orthographic projections of the first via holes K1 (K11/K12/K13/K14) on the base substrate 10 do not overlap orthographic projections of the regions, overlapping the effective parts, of the anode connection parts YZ (YZ1/YZ2/YZ3/YZ4) on the base substrate 10. For example, in the first color sub-pixel spx1, an orthographic projection of the first via K11 (for conduction of the auxiliary part Y12 of the anode Y1 and the anode connection part YZ1) on the base substrate 10 does not overlap an orthographic projection of the region, overlapping the effective part Y13, of the anode adaptor YZ1, i.e., the first overlapping region S1, on the base substrate 10. In the embodiments of the present disclosure, the orthographic projections of the first via holes K1 (K11/K12/K13/K14) on the base substrate 10 do not overlap the orthographic projections of the regions, overlapping the effective parts, of the anode connection parts YZ (YZ1/YZ2/YZ3/YZ4) on the base substrate 10, and therefore the situation that when regions where the first vie holes are located overlap the regions, overlapping the effective parts, of the anode connection parts YZ (YZ1/YZ2/YZ3/YZ4), the overlapping regions may be uneven, and flatness compensation cannot be realized may be avoided.

In some examples, as shown in FIG. 5A, in at least part of the sub-pixels, the effective part of each anode has an overlapping region with both adjacent signal lines Vd in the first direction F1. For example, in the first color sub-pixel spx1, the effective part Y13 of the anode Y1 has an overlapping region with both adjacent signal lines Vd in the first direction F1. In the embodiments of the present disclosure, in at least part of the sub-pixels, the effective part of each anode has or do not have an overlapping region with two adjacent signal lines in the first direction, so that the color shift problem caused when the effective part of each anode merely overlaps the signal line on one side in the first direction may be avoided.

In some examples, it is also possible that in all sub-pixels, the effective part of each anode has overlapping regions with both adjacent signal lines Vd in the first direction F1.

Specifically, an overlapping region of the effective part of each anode and the corresponding first signal line in the first direction is taken as a third overlapping region, an overlapping region of the effective part of each anode and the corresponding second signal line in the first direction is taken as a fourth overlapping region, and the third overlapping region and the fourth overlapping region are located on both sides of the effective part of each anode in the first direction. For example, a ratio of the distance from the third overlapping region to a straight line passing through the center of the corresponding effective part and perpendicular to the first direction to the distance from the fourth overlapping region to the straight line is 0.8-1.2, or may further be equal. For example, the third overlapping region and the corresponding fourth overlapping region are substantially symmetrical with respect to the line passing through the center of the corresponding effective part and perpendicular to the first direction. For example, as shown in FIG. 5B, in the third color sub-pixel spx3, an overlapping region of the effective part Y33 of the anode Y3 with the first signal line Vd1 in the first direction F1 is taken as a third overlapping region S3", an overlapping region of the effective part Y33 of the anode Y3 with the second signal line Vd2 in the first direction F1 is taken as a fourth overlapping region S3'", and the third overlapping region S3" and the fourth overlapping region S3'" are located on both sides of the effective part Y33 of the anode Y3 in the first direction F1. For example, a ratio of the distance from the third overlapping region S3" to a straight line Y passing through the center O3 of the effective part Y33 and perpendicular to the first direction F1 to the distance from the fourth overlapping region S3'" to the straight line is 0.8-1.2, or may further be equal. For example, the third overlapping region S3" and the fourth overlapping region S3'" are substantially symmetrical with respect to the straight line Y passing through the center O3 of the effective part Y33 and perpendicular to the first direction F1.

Embodiments of the present disclosure further provide a display device including a display substrate as provided in the embodiments of the present disclosure.

Although preferred embodiments of the present disclosure have been described, additional variations and modifications of these embodiments will occur to those skilled in the art upon attaining the basic inventive concept. It is therefore intended that the appended claims be interpreted as including the preferred embodiments and all such alterations and modifications as fall within the true scope of the present disclosure.

It will be apparent to those skilled in the art that various modifications and variations can be made in the embodiments of the present disclosure without departing from the spirit or scope of the embodiments of the present disclosure. Thus, it is intended that the present disclosure covers the modifications and variations of this embodiment provided they come within the scope of the appended claims and their equivalents.

What is claimed is:

1. A display substrate, comprising:
   a plurality of sub-pixels on a base substrate, wherein each of the plurality of sub-pixels comprises a drive transistor and a data writing transistor, and the drive transistor is electrically connected with the data writing transistor;
   a first conductive layer on one side of the base substrate, wherein the first conductive layer comprises:
      a plurality of signal lines which are sequentially disposed in a first direction and extend towards a second direction, wherein the plurality of signal lines is electrically connected with the data writing transistor to provide data lines for the data writing transistor; and
      signal line bulges and anode connection parts located between two adjacent signal lines among at least part of the plurality of signal lines and disposed alternately, wherein the signal line bulges comprise a part extending along the first direction, and the data writing transistor is electrically connected with the plurality of signal lines through the signal line bulges;
   a pixel defining layer on a side, facing away from the base substrate, of the first conductive layer, wherein the pixel defining layer comprises:
      a plurality of sub-pixel openings corresponding to the plurality of sub-pixels; and
      anodes between the first conductive layer and the pixel defining layer, wherein each of the anodes comprises:
         an effective part exposed by a respective one of the plurality of sub-pixel openings of the pixel defining layer formed subsequently, a first insulating layer being disposed between the anodes and the first conductive layer, and the anode connection parts being connected with the anodes through insulating layers via holes penetrating the first insulating layer;
   wherein the effective part of at least part of the plurality of sub-pixels have overlapping regions with the signal line bulges and the anode connection parts in the second direction, and the second direction is perpendicular to the first direction.

2. The display substrate according to claim 1, wherein the plurality of sub-pixels comprises:
   first sub-pixels and second sub-pixels, and an area of an anode of each first sub-pixel is larger than an area of an anode of each second sub-pixel; and an effective part of each first sub-pixel has overlapping regions with a respective one of the signal line bulges and a respective one of the anode connection parts in the second direction.

3. The display substrate according to claim 2, wherein the overlapping region of the effective part of each first sub-pixel and the respective one signal line bulge is a first overlapping region, and the overlapping region of the effective part of each first sub-pixel and the respective one anode connection part is a second overlapping region; and
in the second direction, the first overlapping region and the second overlapping region are located on both sides of a center of the effective part of the each first sub-pixel, respectively.

4. The display substrate according to claim 3, wherein a ratio of a spacing from the first overlapping region to the center of the effective part of the each first sub-pixel to a spacing from the second overlapping region to the center of the effective part of the each first sub-pixel is 0.8-1.2.

5. The display substrate according to claim 2, wherein an orthographic projection of an anode connection part of each second sub-pixel on the base substrate covers a center of an orthographic projection of an effective part of the second sub-pixel on the base substrate, and a maximum size of the anode connection part of the each second sub-pixel in the second direction is greater than a maximum size of the effective part in the second direction.

6. The display substrate according to claim 2, wherein a length of an anode connection part of each second sub-pixel in the second direction is greater than a length of an anode connection part of each first sub-pixel in the second direction.

7. The display substrate according to claim 2, wherein each signal line bulge comprises:
a first bulge connection part and a second bulge connection part for connecting the first bulge connection part with a respective one of the plurality of signal lines; and
a length of the first bulge connection part in the second direction is greater than a length of the second bulge connection part in the second direction.

8. The display substrate according to claim 7, wherein a ratio of a length of the first bulge connection part in the first direction to a length of a respective one of the anode connection parts in the first direction is 0.8-1.2.

9. The display substrate according to claim 8, wherein a length of the first bulge connection part in the second direction is less than a length of the respective one anode connection part in the second direction.

10. The display substrate according to claim 7, wherein in a direction from the second bulge connection part to the first bulge connection part, an interval exists between the first bulge connection part and the nearest signal line.

11. The display substrate according to claim 10, wherein a ratio of a length of the interval in the first direction to a length of the second bulge connection part in the first direction is 0.8-1.2.

12. The display substrate according to claim 7, wherein the effective part of each first sub-pixel is substantially in a diamond shape;
an overlapping region of the effective part of the first sub-pixel and a corresponding first bulge connection part is substantially a triangular region;
an overlapping region of the effective part of the first sub-pixel and the respective one anode connection part is substantially a triangular region; and
the overlapping region of the effective part of the first sub-pixel and the corresponding first bulge connection part and the overlapping region of the effective part of the first sub-pixel and the respective one anode connection part correspond to two opposite corners of the diamond shape, respectively.

13. The display substrate according to claim 12, wherein each anode comprises;
a main part and an auxiliary part electrically connected to each other;
the main part comprises the effective part and an anode extension extending from the effective part; and
a part on a side, facing the corresponding second sub-pixel, of an anode extension of each first sub-pixel has an orthographic projection on the base substrate which covers a first region, and the first region comprises at least part of a region between two channel regions of a threshold compensation transistor in a pixel circuit corresponding to the corresponding second sub-pixel;
wherein the anode extension surrounds the effective part, and an outer contour shape of the anode extension is substantially same as an outer contour shape of the effective part;
wherein the auxiliary part extends from the anode extension to one side of a corresponding anode connection part in the second direction.

14. The display substrate according to claim 7, wherein in a same sub-pixel, a side edge, away from the anode connection part, of the first bulge connection part and a side edge, away from the anode connection part, of the second bulge connection part are in a same straight line.

15. The display substrate according to claim 2, wherein a shape of an effective part of each second sub-pixel is substantially a quadrangular region; and
in a column direction, a size of a portion, overlapping the corresponding anode connection part, of the effective part accounts for 50%-100% of a size of the effective part.

16. The display substrate according to claim 13, wherein auxiliary parts are electrically connected with the anode connection parts through first via holes penetrating the first insulating layer; and
orthographic projections of the first via holes on the base substrate do not overlap orthographic projections of regions, overlapping the effective parts, of the anode connection parts on the base substrate.

17. The display substrate according to claim 2, wherein each first sub-pixel comprises:
a first color sub-pixel and a third color sub-pixel;
each second sub-pixel comprises:
a second color sub-pixel and a fourth color sub-pixel; and
the first color sub-pixel is a red sub-pixel, the third color sub-pixel is a blue sub-pixel, and the second color sub-pixel and the fourth color sub-pixel are green sub-pixels.

18. The display substrate according to claim 2, wherein the plurality of signal lines comprise;
first signal lines and second signal lines;
one column of sub-pixels correspond to one first signal line and one second signal line;
signal line bulges electrically connected with the first signal lines are electrically connected with sub-pixels in odd-numbered lines, respectively, and signal line bulges electrically connected with the second signal lines are electrically connected with sub-pixels in even-numbered lines, respectively; and in the two first signal lines and the two second signal lines corresponding to every two adjacent columns of sub-pixels, the two first signal lines are adjacent and form a first signal line group, or, the two second signal lines are adjacent and form a second signal line group.

19. The display substrate according to claim 1, wherein the effective parts of at least part of the sub-pixels have overlapping regions with the two adjacent signal lines in the first direction; and in the sub-pixels, the effective parts have third overlapping regions with first signal lines, the effective parts have fourth overlapping regions with second signal lines, and each third overlapping region and each fourth overlapping region are located on both sides of the effective part of the corresponding anode in the first direction.

20. A display device, comprising the display substrate according to claim 1.

* * * * *